(12) United States Patent
Tabata et al.

(10) Patent No.: US 9,006,957 B2
(45) Date of Patent: Apr. 14, 2015

(54) POWER GENERATION UNIT, ELECTRONIC APPARATUS, TRANSPORTATION DEVICE, AND METHOD OF CONTROLLING POWER GENERATION UNIT

(71) Applicant: Seiko Epson Corporation, Tokyo (JP)

(72) Inventors: Kunio Tabata, Shiojiri (JP); Atsuya Hirabayashi, Chino (JP); Atsushi Oshima, Shiojiri (JP); Hiroyuki Yoshino, Suwa (JP); Noritaka Ide, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 417 days.

(21) Appl. No.: 13/633,190

(22) Filed: Oct. 2, 2012

(65) Prior Publication Data
US 2013/0082566 A1 Apr. 4, 2013

(30) Foreign Application Priority Data

Oct. 3, 2011 (JP) ................................. 2011-218989
Oct. 3, 2011 (JP) ................................. 2011-219333

(51) Int. Cl.
*H01L 41/113* (2006.01)
*H02N 2/18* (2006.01)

(52) U.S. Cl.
CPC ............ *H01L 41/1136* (2013.01); *H02N 2/181* (2013.01)

(58) Field of Classification Search
CPC ............ G01L 1/16; H02N 2/18; H02N 2/181; H02N 2/183; H02N 2/186; F23P 3/002
USPC ...................... 310/316.01, 318, 319, 329, 339
See application file for complete search history.

(56) References Cited

U.S. PATENT DOCUMENTS

| | | | |
|---|---|---|---|
| 5,552,656 | A | 9/1996 | Taylor |
| 5,801,475 | A | 9/1998 | Kimura |
| 6,252,336 | B1 | 6/2001 | Hall |
| 6,522,048 | B1 | 2/2003 | Burns et al. |
| 8,026,650 | B2 | 9/2011 | Ramadass et al. |

(Continued)

FOREIGN PATENT DOCUMENTS

| | | |
|---|---|---|
| JP | 07-107752 A | 4/1995 |
| JP | 2005-312269 A | 11/2005 |

(Continued)

OTHER PUBLICATIONS

E. Lefeuvre et al., "A comparison between several vibration-powered piezoelectric generators for standalone systems", Sensors and Actuators A: Physical, vol. 126, Issue 2, Feb. 14, 2006, pp. 405-416.

*Primary Examiner* — Thomas Dougherty
(74) *Attorney, Agent, or Firm* — Maschoff Brennan

(57) ABSTRACT

A power generation unit includes a deforming member (a beam) adapted to deform while switching a deformation direction, a first piezoelectric device provided to the deforming member (the beam), a second piezoelectric device provided to the deforming member (the beam), an inductor electrically connected to the first piezoelectric device, a switch disposed between the first piezoelectric device and the inductor, and a control section adapted to detect a voltage generated in the second piezoelectric device, and if the voltage detected has a level one of equal to and higher than a predetermined level, electrically connect the first piezoelectric device and the inductor to each other using the switch.

19 Claims, 18 Drawing Sheets

(56) References Cited

U.S. PATENT DOCUMENTS

| | | |
|---|---|---|
| 8,368,290 B2 | 2/2013 | Kwon et al. |
| 8,373,332 B2 * | 2/2013 | Lee .............................. 310/339 |
| 8,604,673 B2 * | 12/2013 | Tabata et al. .................. 310/339 |
| 8,653,718 B2 * | 2/2014 | Ide et al. ....................... 310/319 |
| 8,836,199 B2 * | 9/2014 | Ide et al. ....................... 310/319 |
| 2010/0102782 A1 | 4/2010 | Thiesen et al. |
| 2012/0119618 A1 | 5/2012 | Tabata et al. |
| 2012/0126666 A1 | 5/2012 | Tabata et al. |
| 2012/0280596 A1 | 11/2012 | Ide et al. |

FOREIGN PATENT DOCUMENTS

| | | |
|---|---|---|
| JP | 4835888 B1 | 12/2011 |
| JP | 4835889 B1 | 12/2011 |

* cited by examiner

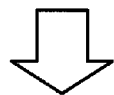

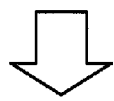

POWER GENERATION UNIT, ELECTRONIC APPARATUS, TRANSPORTATION DEVICE, AND METHOD OF CONTROLLING POWER GENERATION UNIT

BACKGROUND

1. Technical Field

The present invention relates to a power generation unit, an electronic apparatus, a transportation device, and a method of controlling the power generation unit.

2. Related Art

When a piezoelectric material such as lead zirconium titanate (PZT), quartz crystal ($SiO_2$), or zinc oxide (ZnO) is deformed in response to an external force, electrical polarization is induced inside the material, and positive and negative charges appear on the surfaces. Such a phenomenon is called a so-called piezoelectric effect. There has been proposed an electrical power generation method of vibrating a cantilever to thereby make a weight repeatedly act on the piezoelectric material, and thus taking out the charge generated on the surface of the piezoelectric material as electricity using such a characteristic provided to the piezoelectric material.

For example, by vibrating a metal cantilever having a mass disposed at the tip and a thin plate made of the piezoelectric material bonded thereto, and taking out the positive and negative charges alternately generated on the piezoelectric material due to the vibration, an alternating current is generated. The alternating current is rectified using diodes, and then stored in a capacitor, and then taken out as electricity. Such a technology has been proposed in JP-A-7-107752. There has been also proposed a technology of arranging that a junction is closed only during the period in which the positive charges are generated in a piezoelectric device to thereby make it possible to obtain a direct current without causing a voltage loss in the diodes (JP-A-2005-312269). Since it is possible to miniaturize the power generation unit by using these technologies, there is expected an application of, for example, incorporating the power generation unit in, for example, a small-sized electronic component instead of a battery.

However, in the proposed technology according to the related art, there arises a problem that the obtainable voltage is limited up to the voltage generated by the electrical polarization of the piezoelectric material. Therefore, in most cases, an additional step-up circuit is required, and there arises a problem that it is difficult to sufficiently miniaturize the power generation unit.

SUMMARY

An advantage of some aspects of the invention is to provide a technology capable of generating a high voltage without growing the power generation unit using the piezoelectric effect of the piezoelectric material in size.

The can be implemented as the following forms or application examples.

Application Example 1

A power generation unit according to this application example of the invention includes a deforming member adapted to deform while switching a deformation direction, a first piezoelectric device provided to the deforming member, a second piezoelectric device provided to the deforming member, an inductor electrically connected to the first piezoelectric device, a switch disposed between the first piezoelectric device and the inductor, and a control section adapted to detect a current generated in the second piezoelectric device, and if the current detected has a level one of equal to and higher than a predetermined level, electrically connect the first piezoelectric device and the inductor to each other via the switch.

According to this application example, since the first piezoelectric device and the second piezoelectric device are provided to the deforming member, if the deforming member deforms, the first piezoelectric device and the second piezoelectric device are also deformed. As a result, positive and negative charges are generated in the piezoelectric devices due to the piezoelectric effect. The generation amount of the charge increases as the deformation amount of the piezoelectric device increases. The first piezoelectric device constitutes the resonant circuit together with the inductor, and the resonant circuit is provided with the switch. The deformation of the deforming member is started in the state in which the conduction in the switch is cut, and the switch is set to the conductive state when the deformation amount reaches an extreme value (i.e., the deformation direction is switched). Since the first piezoelectric device is deformed together with the deforming member, and generates more charge as the deformation amount increases, when the charge generated in the first piezoelectric device reaches the maximum value, the first piezoelectric device is connected to the inductor to thereby form the resonant circuit. Then, the charges generated in the first piezoelectric device flows into the inductor. Since the first piezoelectric device and the inductor constitute the resonant circuit, the current having flown into the inductor overshoots, and then flows into the terminal on the opposite side of the first piezoelectric device. This period (i.e., the period until the charge flown out from one terminal of the first piezoelectric device flows again into the first piezoelectric device through the opposite side terminal via the inductor) is a half of the resonance period of the resonant circuit composed of the first piezoelectric device and the inductor. Therefore, by forming the resonant circuit by setting the switch to the connected state when the deformation direction of the first piezoelectric device is switched, and then setting the switch to the disconnected state when the time period half as long as the resonance period has elapsed, it is possible to reverse the locations of the positive and negative charges having been generated in the first piezoelectric device before connecting the inductor. Then, when deforming the deforming member in turn in the opposite direction from that state, since the first piezoelectric device is deformed in the opposite direction, the charges are accumulated in the first piezoelectric device in such a manner that the new charges further generated by the piezoelectric effect in the state in which the locations of the positive and negative charges are reversed are stacked incrementally thereon. Since the voltage generated also increases as the charges are stored in the first piezoelectric device, it is possible to generate a voltage higher than the voltage generated by the electrical polarization of the piezoelectric material forming the first piezoelectric device without additionally preparing a step-up circuit. Further, in order to efficiently accumulate the charges in the first piezoelectric device in such a manner, it is important to connect the switch when the deformation direction of the first piezoelectric device is switched to thereby form the resonant circuit. Here, since the first piezoelectric device and the second piezoelectric device are provided to the deforming member, if the deformation direction of the first piezoelectric device is switched, the deformation direction of the second piezoelectric device is also switched. The timing at which the deformation direction of the second piezoelectric device is switched coincides with the timing (the timing at which the current vanishes) at which the direction of the current due to the charge generated by the second piezoelectric device is switched. Therefore, by detecting the current generated in the second piezoelectric device, the switch can easily be set to the conductive state at the timing at which the deformation direction of the deforming member is switched. The control section sets the switch to the conductive state for a predetermined period of time started from the switching of the deformation direction of the first piezoelectric device to thereby make it possible to efficiently store the charges in the first piezoelectric device. Therefore, it is possible to realize the small-sized power generation unit capable of efficiently generating a high voltage using the piezoelectric effect.

Application Example 2

In the power generation unit according to the above application example, it is preferable that the control section electrically connects the switch at a timing at which a deformation direction of the deforming member is switched, and then electrically disconnects the switch at a timing at which a predetermined period has elapsed.

According to this application example, since the connection/disconnection between the piezoelectric device and the inductor can periodically be repeated at appropriate timings in sync with the deformation state (vibration state) of the deforming member by electrically connecting (setting the switch to the conductive state) the switch at the timing at which the deformation direction of the deforming member is switched, it becomes possible to efficiently store the charges in the piezoelectric device.

Application Example 3

In the power generation unit according to the above application example, it is preferable that the control section includes a capacitor connected in parallel to the second piezoelectric device, and a current detect circuit adapted to detect a current flowing in the capacitor.

Since the capacitor is connected in parallel to the second piezoelectric device, the current having the same phase as that of the current generated in the second piezoelectric device flows in the capacitor. Therefore, by detecting the current flowing in the capacitor, the timing (the timing at which the current vanishes) at which the direction of the current due to the charge generated in the second piezoelectric device is switched can easily be detected.

Application Example 4

In the power generation unit according to the above application example, it is preferable that the deforming member has a plurality of surfaces, the first piezoelectric device is provided to a first surface of the deforming member, and the second piezoelectric device is provided to a second surface of the deforming member different from the first surface.

Assuming that the first piezoelectric device and the second piezoelectric device are disposed on the same surface of the deforming member, the installation area of the first piezoelectric device is reduced due to the presence of the second piezoelectric device. If the deformation amount is the same, the larger the installation area of the piezoelectric device is, the higher the power generation capacity is. Therefore, if it is arranged that the first piezoelectric device and the second piezoelectric device are disposed on the respective surfaces of the deforming member different from each other, the installation area of the first piezoelectric device can be increased, and therefore, the power generation capacity of the power generation unit can be improved.

Application Example 5

In the power generation unit according to the above application example, it is preferable that the deforming member has a plurality of surfaces, and the first piezoelectric device and the second piezoelectric device are provided to the same surface of the deforming member.

If the first piezoelectric device and the second piezoelectric device are disposed on the same surface of the deforming member, the first piezoelectric device and the second piezoelectric device can be provided to the deforming member at a time (in the same process). Therefore, it becomes possible to manufacture the power generation unit with high productivity.

Application Example 6

In the power generation unit according to the above application example, it is preferable that the deforming member has an undeformable stationary end, and the second piezoelectric device is disposed at a place closer to the stationary end of the deforming member than a place in the deforming member at which the first piezoelectric device is disposed.

The bending moment of a part of the deforming member increases as the part comes closer to the stationary end, and the deformation amount per unit length of the deforming member also increases in conjunction therewith. Therefore, by disposing the second piezoelectric device in the vicinity of the stationary end, the sensitivity as the sensor is improved, and the area of the second piezoelectric device can be reduced accordingly. In addition, in the case of disposing the first piezoelectric device and the second piezoelectric device on the same surface, the area of the first piezoelectric device for power generation can be increased as much as the area which can be reduced from the area of the second piezoelectric device, it becomes possible to prevent the degradation of the power generation capacity caused by disposing the first piezoelectric device and the second piezoelectric device on the same surface.

Application Example 7

An electronic apparatus according to this application example is an electronic apparatus using the power generation unit according to any one of the application examples described above.

Application Example 8

A transportation device according to this application example is a transportation device using the power generation unit according to any one of the application examples described above.

According to these application examples of the invention, since it is possible to incorporate the power generation unit in the electronic apparatus such as a remote controller instead of a battery, the power can be generated due to the transportation of the electronic apparatus, and in addition, by using the power generation unit according to the invention in a transportation device such as a vehicle or a electric train, it is also possible to generate electricity by the vibration due to the transportation, and to efficiently supply the electricity to the equipment provided to the transportation device.

Application Example 9

A method of controlling a power generation unit according to this application example of the invention is directed to a method of controlling a power generation unit including a deforming member adapted to deform while switching a deformation direction, a first piezoelectric device provided to the deforming member, a second piezoelectric device provided to the deforming member, an inductor electrically connected to the first piezoelectric device, and a switch disposed between the first piezoelectric device and the inductor. The method includes detecting a current generated in the second piezoelectric device, and connecting the first piezoelectric device and the inductor electrically to each other via the switch based on the detection result of the current.

According to this application example, since the first piezoelectric device and the second piezoelectric device are provided to the deforming member, if the deformation direction of the first piezoelectric device is switched, the deformation direction of the second piezoelectric device is also switched. The timing at which the deformation direction of the second piezoelectric device is switched coincides with the timing (the timing at which the current vanishes) at which the direction of the current due to the charge generated by the second piezoelectric device is switched. Therefore, by detecting the current generated in the second piezoelectric device, and then setting the switch to the conductive state for a predetermined period of time based on the current detected, it becomes possible to efficiently accumulate the charges in the first piezoelectric device. Since the voltage generated by the first piezoelectric device also increases in accordance with the charge accumulated in the first piezoelectric device, it is possible to generate a voltage higher than the voltage generated by the electrical polarization of the piezoelectric material without additionally preparing a step-up circuit.

Application Example 10

A power generation unit according to this application example of the invention includes a deforming member adapted to deform while switching a deformation direction, a first piezoelectric device provided to the deforming member, a second piezoelectric device provided to the deforming member, and adapted to generate electrical power, an amount of which is smaller than an amount of electrical power generated by the first piezoelectric device, an inductor electrically connected to the first piezoelectric device, a switch disposed between the first piezoelectric device and the inductor, and a control section adapted to detect a voltage generated in the second piezoelectric device, and if the voltage detected has a level one of equal to and higher than a predetermined level, electrically connect the first piezoelectric device and the inductor to each other using the switch.

According to this application example, since the first piezoelectric device and the second piezoelectric device are provided to the deforming member in the power generation unit, if the deforming member deforms, the first piezoelectric device and the second piezoelectric device are also deformed. As a result, positive and negative charges are generated in the piezoelectric devices due to the piezoelectric effect. The generation amount of the charge increases as the deformation amount of the piezoelectric device increases. The first piezoelectric device constitutes the resonant circuit together with the inductor, and the resonant circuit is provided with the switch. The deformation of the deforming member is started in the state in which the conduction in the switch is cut, and the switch is set to the conductive state when the deformation amount reaches an extreme value (i.e., the deformation direction is switched). Since the first piezoelectric device (and the second piezoelectric device) is deformed together with the deforming member, and generates more charge as the deformation amount increases, when the charge generated in the first piezoelectric device (and the second piezoelectric device) reaches the maximum value, the first piezoelectric device is connected to the inductor to thereby form the resonant circuit. Then, the charges generated in the first piezoelectric device flows into the inductor. Since the first piezoelectric device and the inductor constitute the resonant circuit, the current having flown into the inductor overshoots, and then flows into the terminal on the opposite side of the first piezoelectric device. This period (i.e., the period until the charge flown out from one terminal of the first piezoelectric device flows again into the first piezoelectric device through the opposite side terminal via the inductor) is a half of the resonance period of the resonant circuit composed of the first piezoelectric device and the inductor. Therefore, by forming the resonant circuit by setting the switch to the connected state when the deformation direction of the first piezoelectric device is switched, and then setting the switch to the disconnected state when the time period half as long as the resonance period has elapsed, it is possible to reverse the locations of the positive and negative charges having been generated in the first piezoelectric device before connecting the inductor. Then, when deforming the deforming member in turn in the opposite direction from that state, since the first piezoelectric device is deformed in the opposite direction, the charges are accumulated in the first piezoelectric device in such a manner that the new charges further generated by the piezoelectric effect in the state in which the locations of the positive and negative charges are reversed are stacked incrementally thereon. Since the voltage generated also increases as the charges are stored in the first piezoelectric device, it is possible to generate a voltage higher than the voltage generated by the electrical polarization of the piezoelectric material forming the first piezoelectric device without additionally preparing a step-up circuit. Further, in order to efficiently accumulate the charges in the first piezoelectric device in such a manner, it is important to connect the switch when the deformation direction of the first piezoelectric device is switched to thereby form the resonant circuit. Here, since the first piezoelectric device and the second piezoelectric device are provided to the deforming member, if the deformation direction of the first piezoelectric device is switched, the deformation direction of the second piezoelectric device is also switched. Since the larger the deformation amount is, the higher voltage the second piezoelectric device generates, at the position where the deformation direction of the second piezoelectric device is switched, the voltage generated by the second piezoelectric device takes an extreme value. Therefore, by detecting the voltage generated in the second piezoelectric device, and then setting the switch to the conductive state for a predetermined period of time from the time point when the voltage takes the extreme value, it becomes possible to efficiently accumulate the charges in the first piezoelectric device. As a result, it becomes unnecessary to provide an additional step-up circuit, and thus it becomes possible to obtain a small-sized and highly efficient power generation unit.

Application Example 11

In the power generation unit according to the above application example, it is preferable that the first piezoelectric device is higher in piezoelectric constant than the second piezoelectric device.

In general, the higher the piezoelectric constant of the piezoelectric device is, the higher the power generation capacity is. Therefore, by setting the piezoelectric constant of the first piezoelectric device to be higher than that of the second piezoelectric device, the voltage higher than the voltage of the second piezoelectric device is generated by the first piezoelectric device used for supplying the charge to the outside, and the power generation capacity of the power generation unit can be improved.

Application Example 12

In the power generation unit according to the above application example, it is preferable that the first piezoelectric device is larger in area of a part capable of generating electrical power than the second piezoelectric device.

In the piezoelectric devices having the equivalent power generation capacity, the larger the area of the part capable of generating the electrical power, the higher the power generation capacity is. Therefore, by setting the area of the part capable of generating the electrical power of the first piezoelectric device to be larger than that of the second piezoelectric device, the voltage higher than the voltage of the second piezoelectric device is generated by the first piezoelectric device used for supplying the charge to the outside, and the power generation capacity of the power generation unit can be improved.

Application Example 13

In the power generation unit according to the above application example, it is preferable that the number of the first piezoelectric devices is plural.

The larger the plural number of the first piezoelectric devices is, the more the power generation amount becomes. Therefore, by providing a plurality of first piezoelectric devices, a higher voltage than the voltage of the second piezoelectric device is generated from the first piezoelectric device used for supplying the charge to the outside, and the power generation capacity of the power generation unit can be improved.

Application Example 14

In the power generation unit according to the above application example, it is preferable that the deforming member has a plurality of surfaces, the first piezoelectric device is provided to a first surface of the deforming member, and the second piezoelectric device is provided to a second surface of the deforming member different from the first surface.

Assuming that the first piezoelectric device and the second piezoelectric device are disposed on the same surface of the deforming member, the installation area of the first piezoelectric device is reduced due to the presence of the second piezoelectric device. If the deformation amount is the same, the larger the installation area of the piezoelectric device is, the higher the power generation capacity is. Therefore, if it is arranged that the first piezoelectric device and the second piezoelectric device are disposed on the respective surfaces of the deforming member different from each other, the installation area of the first piezoelectric device can be increased, and therefore, the power generation capacity of the power generation unit can be improved.

Application Example 15

In the power generation unit according to the above application example, it is preferable that the first piezoelectric device and the second piezoelectric device are provided to the same surface of the deforming member.

If the first piezoelectric device and the second piezoelectric device are disposed on the same surface of the deforming member, the first piezoelectric device and the second piezoelectric device can be provided to the deforming member at a time (in the same process). Therefore, it becomes possible to manufacture the power generation unit with high productivity.

Application Example 16

In the power generation unit according to the above application example, it is preferable that the first piezoelectric device and the second piezoelectric device are equal in length in a longitudinal direction to each other.

If the first piezoelectric device and the second piezoelectric device are equal in length in the longitudinal direction to each other, the first piezoelectric device and the second piezoelectric device are deformed in sync with the deformation of the deforming member in the longitudinal direction. Therefore, when the deformation direction of the first piezoelectric device is switched, the deformation direction of the second piezoelectric device is also switched in sync therewith, and therefore, the timing at which the deformation direction of the first piezoelectric device is switched and the timing at which the deformation direction of the second piezoelectric device is switched roughly coincide with each other. As a result, accurate switching of the switch becomes possible, and the power generation unit with high power generation efficiency can be provided as described above.

Application Example 17

In the power generation unit according to the above application example, it is preferable that the deforming member has an undeformable stationary end, and the second piezoelectric device is disposed at a place closer to the stationary end of the deforming member than a place in the deforming member at which the first piezoelectric device is disposed.

In the beam configured including the undeformable stationary end, the bending moment of a part increases as the part moves from the tip (the free end) and comes closer to the stationary end (the base), and the deformation amount of the beam per unit length also increases in conjunction therewith. Therefore, by disposing the second piezoelectric device used for the control in the vicinity of the stationary end, the sensitivity as the sensor is improved, and the width of the second piezoelectric device used for the control can be reduced accordingly. As a result, since the area of the first piezoelectric device used for the power generation can be increased, it becomes possible to suppress the degradation of the power generation capacity caused by disposing the first piezoelectric device used for the power generation and the second piezoelectric device used for the control on the same surface.

Application Example 18

An electronic apparatus according to this application example is an electronic apparatus using the power generation unit according to any one of the application examples described above.

Application Example 19

A transportation device according to this application example is a transportation device using the power generation unit according to any one of the application examples described above.

According to these aspects of the invention, since it is possible to incorporate the power generation unit in a remote controller or a portable electronic apparatus instead of a battery, the power can be generated due to the transportation of the electronic apparatus, and in addition, by using the power generation unit according to the application example of the invention in a transportation device such as a vehicle or a electric train, it is also possible to generate electricity by the vibration due to the transportation, and to efficiently supply the electricity to the equipment provided to the transportation device.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferred embodiments of the invention will be described in detail with reference to the accompanying drawings. The drawings used therein are for the sake of convenience of explanation. The embodiments described below do not unreasonably limit the content of the invention as set forth in the appended claims. Further, all of the constituents described below are not necessarily essential elements of the invention.

Hereinafter, embodiments of the invention will be explained along the following procedure to thereby clarify the content of the invention described above.

A. First Embodiment
  A-1. Structure of Power Generation Unit
  A-2. Operation of Power Generation Unit
  A-3. Operation Principle of Power Generation Unit
  A-4. Switching Timing of Switch
B. Second Embodiment
C. Third Embodiment D. Fourth Embodiment
E. Modified Examples
   E-1. First Modified Example
   E-2. Second Modified Example
   E-3. Third Modified Example

A. FIRST EMBODIMENT

A-1. Structure of Power Generation Unit

Figure 1A:
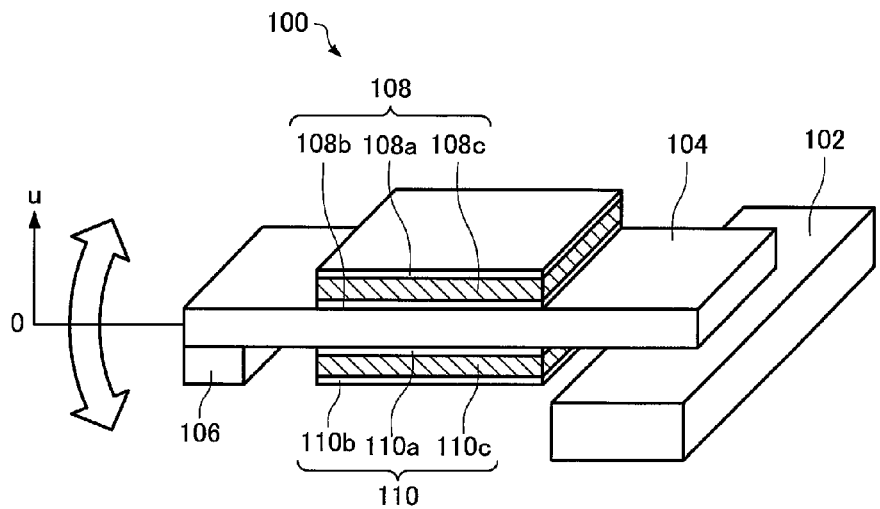
FIG. 1A is an explanatory diagram showing a structure of a power generation unit according to a first embodiment of the invention.
Figure 1B:
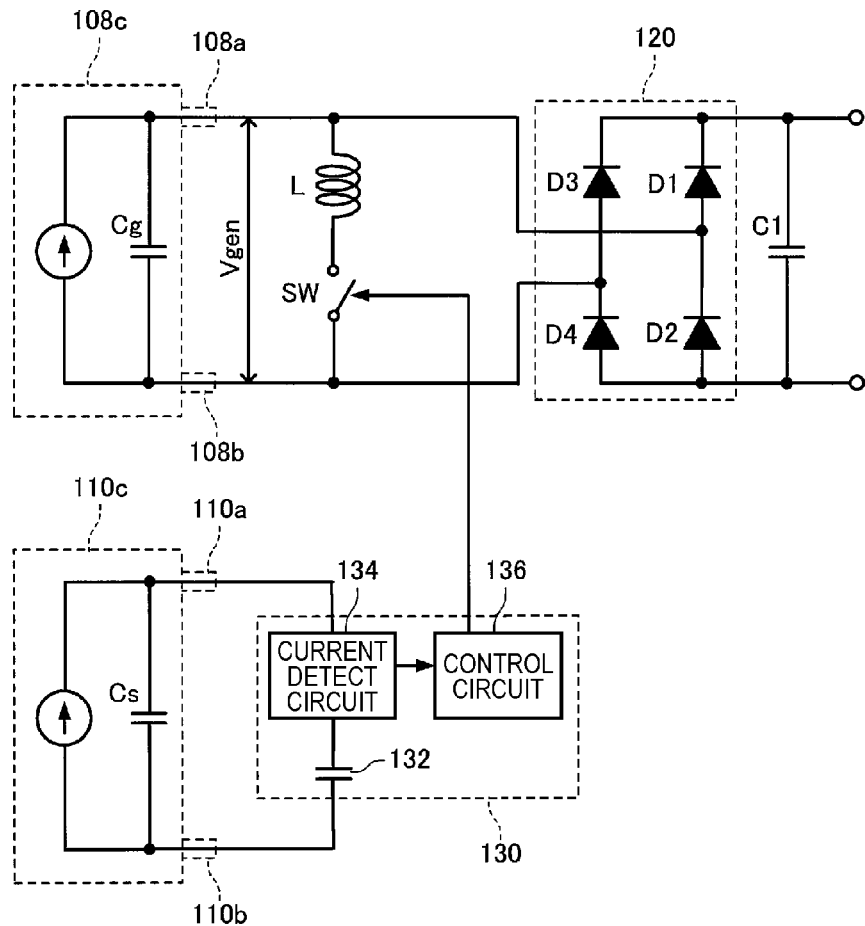
FIG. 1B is an explanatory diagram showing the structure of the power generation unit according to the first embodiment of the invention.

FIGS. 1A and 1B are explanatory diagrams showing a structure of a power generation unit 100 according to the present embodiment. FIG. 1A shows a mechanical structure of the power generation unit 100, and FIG. 1B shows an electrical structure thereof. The mechanical structure of the power generation unit 100 according to the present example is formed as a cantilever structure in which the beam 104 having a mass 106 disposed at the tip thereof is fixed to a base 102 on the base end side thereof, and the beam 104 can deform while switching the deformation direction. The base 102 is preferably fixed inside the power generation unit 100. A piezoelectric device 108 and a piezoelectric device 110 are disposed on the surface of the beam 104. The piezoelectric device 108 is configured including a piezoelectric element 108c formed of a piezoelectric material such as lead zirconium titanate (PZT), and a first electrode (an upper electrode) 108a and a second electrode (a lower electrode) 108b each formed of a metal thin film on the surface of the piezoelectric element 108c. The first electrode (the upper electrode) 108a and the second electrode (the lower electrode) 108b are disposed so as to be opposed to each other across the piezoelectric element 108c. The piezoelectric device 110 is configured including a piezoelectric element 110c formed of a piezoelectric material such as lead zirconium titanate (PZT), and a first electrode (an upper electrode) 110a and a second electrode (a lower electrode) 110b each formed of a metal thin film on the surface of the piezoelectric element 110c. The first electrode (the upper electrode) 110a and the second electrode (the lower electrode) 110b are disposed so as to be opposed to each other across the piezoelectric element 110c. Although the piezoelectric device 108 and the piezoelectric device 110 have the same shape in the example shown in FIG. 1A, it is not necessary required for them to have the same shape. For example, if the piezoelectric device 108 has the maximum installable length and the maximum installable width with respect to the beam 104, a large power generation amount of the piezoelectric device 108 is obtained. On the other hand, if the piezoelectric device 110 has the minimum installable width (the length thereof in the direction along the shorter dimension of the beam 104), the displacement resistance of the beam 104 caused by the piezoelectric device 110 is reduced, and therefore, the power generation efficiency is improved. Further, since the piezoelectric device 108 and the piezoelectric device 110 deform due to the deformation of the beam 104, the beam 104 corresponds to the "deforming member" according to the invention.

Since the beam 104 is fixed to the base 102 at the base end side thereof, and has the mass 106 disposed on the tip side thereof, when a vibration or the like is applied to the beam 104, the tip of the beam 104 vibrates with a large amplitude as indicated by the outlined arrow in the drawing. As a result, a compression force and a tensile force alternately act on the piezoelectric device 108 and the piezoelectric device 110 disposed on the respective surfaces of the beam 104. Then, the piezoelectric element 108c of the piezoelectric device 108 generates positive and negative charges due to the piezoelectric effect, and the charges appear in the first electrode 108a and the second electrode 108b. Similarly, the piezoelectric element 110c of the piezoelectric device 110 generates positive and negative charges due to the piezoelectric effect, and the charges appear in the first electrode 110a and the second electrode 110b. Although the mass 106 is not essential, it is desirable to create imbalance in mass between the tip side and the base end side of the beam 104. This is because the displacement of the beam 104 becomes easy to repeat in response to one vibration, for example, due to the imbalance in mass.

FIG. 1B shows an example of a circuit diagram of the power generation unit 100 according to the present embodiment. The piezoelectric element 108c of the piezoelectric device 108 can electrically be expressed as a current source and a capacitor (a capacitive component) Cg for storing charges. The piezoelectric element 110c of the piezoelectric device 110 can electrically be expressed as a current source and a capacitor (a capacitive component) Cs for storing charges. The inductor L is connected in parallel to the piezoelectric element 108c, and constitutes a resonant circuit including the piezoelectric device 108. In other words, the inductor L is electrically connected to the piezoelectric device 108, and constitutes an electrical resonant circuit together with the capacitive component Cg of the piezoelectric element 108c. Further, the resonant circuit is provided with a switch SW for switching ON/OFF the resonant circuit connected in series to the inductor L.

The control section 130 controls to set the switch SW to the ON/OFF states. Specifically, the control section 130 detects the current generated in the piezoelectric device 110, and if the current detected has a value equal to or higher than a predetermined value, the control section 130 set the switch SW to the conductive state to thereby electrically connect the piezoelectric device 108 and the inductor L to each other via the switch SW. In the present embodiment, the control section 130 is configured including a capacitor 132 connected in parallel to the piezoelectric device 110, a current detect circuit 134 for detecting the current flowing through the capacitor 132, and a control circuit 136 for controlling the switch SW based on the current detected by the current detect circuit 134. The control circuit 136 can also be formed of a central processing unit (CPU). Details of the operation of the control section 130 will be described later.

The first electrode 108a and the second electrode 108b provided to the piezoelectric element 108c of the piezoelectric device 108 are connected to a rectifier 120 for rectifying the current generated by the piezoelectric device 108. In the present embodiment, the rectifier 120 is a full bridge rectifier composed of four diodes D1 through D4. By forming the rectifier 120 with the full bridge rectifier, it is possible to efficiently extract the charge generated by the piezoelectric device 108 to thereby efficiently generate the electrical power. Further, a capacitor (an output capacitor) C1 for storing the current after the rectification for driving an electrical load is connected to the rectifier 120. In other words, the capacitor C1 is connected in parallel to the piezoelectric device 108 via the rectifier 120. The capacitor C1 is not an essential constituent, and can be provided if need arises.

On the other hand, the piezoelectric device 110 is provided for controlling the switch SW, and the first electrode 110a and the second electrode 110b provided to the piezoelectric device 110 are connected to the control section 130. Therefore, it is assumed hereinafter that the piezoelectric device 108 may be referred to as a "power-generating piezoelectric device," and the piezoelectric device 110 may be referred to as a "controlling piezoelectric device." The piezoelectric device 108 corresponds to a "first piezoelectric device"

according to the invention, and the piezoelectric device 110 corresponds to a "second piezoelectric device" according to the invention.

A-2. Operation of Power Generation Unit

Figure 2A:
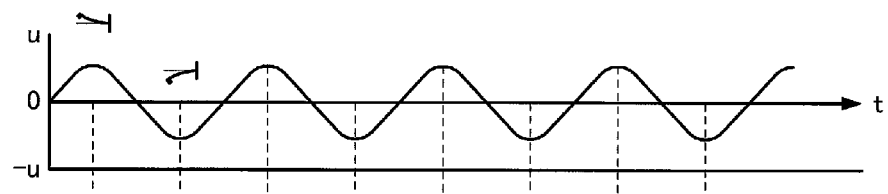
FIGS. 2A through 2D are explanatory diagrams showing an operation of the power generation unit according to the first embodiment.
Figure 2B:
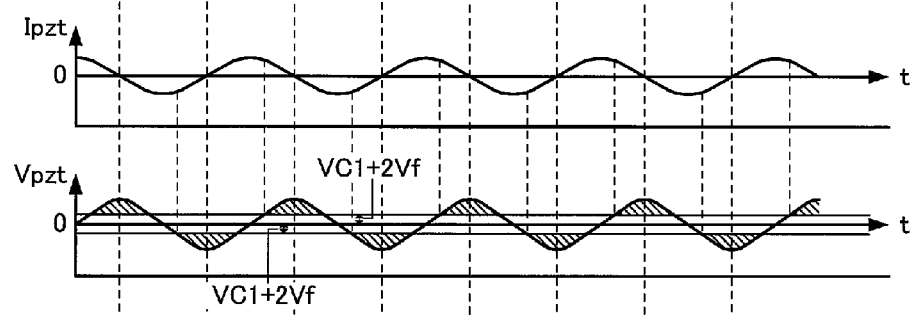

FIGS. 2A through 2D are explanatory diagrams showing the operation of the power generation unit 100 according to the present embodiment. FIG. 2A shows how the displacement u of the tip of the beam 104 varies due to the vibration of the beam 104. The positive displacement u represents the state (the state in which the upper surface side of the beam 104 has a concave shape) in which the beam 104 is warped upward, and the negative displacement (−u) represents the state (the state in which the lower surface side of the beam 104 has a concave shape) in which the beam 104 is warped downward. FIG. 2B shows the state of the current generated by the piezoelectric element 108c due to the deformation of the beam 104 and the electromotive force caused inside the piezoelectric element 108c as a result thereof. In FIG. 2B the state of the charge generated in the piezoelectric element 108c is expressed as an amount of the charge (i.e., a current Ipzt) generated per unit time, and the electromotive force generated in the piezoelectric element 108c is expressed as the voltage Vpzt generated between the first electrode 108a and the second electrode 108b.

As described above with reference to FIG. 1A, the beam 104 is also provided with the piezoelectric device 110, and when the beam 104 deforms, the piezoelectric element 110c also deforms similarly to the piezoelectric element 108c. Therefore, the current Ipzt2 similar to the current Ipzt shown in FIG. 2B, and the voltage Vpzt2 similar to the voltage Vpzt shown in FIG. 2B are also generated inside the piezoelectric element 110c in just the same manner as the piezoelectric element 108c.

As shown in FIGS. 2A and 2B, during the period in which the displacement of the beam 104 keeps increasing, the piezoelectric element 108c generates a current in the positive direction (i.e., the current Ipzt takes a positive value), and the voltage Vpzt between the first electrode 108a and the second electrode 108b increases in the positive direction in conjunction therewith. If the voltage Vpzt in the positive direction exceeds the sum of the voltage VC1 of the capacitor C1 and a twofold of the forward voltage drop Vf of the diode constituting the rectifier 120, namely VC1+2Vf, the charge generated thereafter can be taken out as a direct current and stored in the capacitor C1. During the period in which the displacement of the beam 104 keeps decreasing, the piezoelectric element 108c generates a current in the negative direction (i.e., the current Ipzt takes a negative value), and the voltage Vpzt between the first electrode 108a and the second electrode 108b increases in the negative direction in conjunction therewith. If the voltage Vpzt in the negative direction exceeds the sum of VC1 and 2Vf of the rectifier 120, the charge generated can be taken out as a direct current and stored in the capacitor C1. In other words, even when keeping the switch SW shown in FIG. 1B in the OFF state, the charge can be stored in the capacitor C1 regarding the part indicated by hatching in FIG. 2B.

Figure 2C:
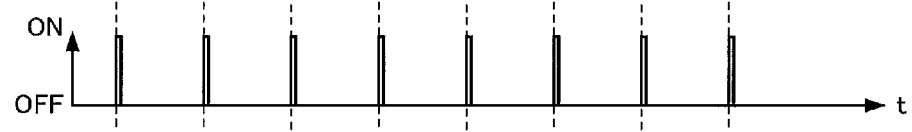

The amount of the charge (a power generation efficiency) which can be taken out from the piezoelectric element 108c in a predetermined period of time differs according to the timing at which the switch SW is set to the ON state, and the power generation efficiency is maximized in the case in which the switch SW is set to the ON state at the timing at which the deformation direction of the beam 104 is switched as shown in FIG. 2C. Hereinafter, the operation in the case in which the power generation efficiency is maximized will firstly be explained.

Figure 2D:
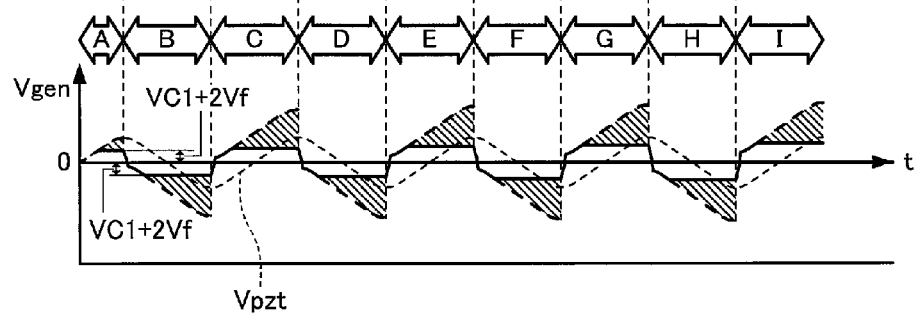

It is assumed that the control section 130 set the switch SW to the ON state at the timing shown in FIG. 2C. Then, as shown in FIG. 2D, there occurs a phenomenon that the voltage waveform between the first electrode 108a and the second electrode 108b varies as if it is shifted at the moment that the switch SW is set to the ON state. Specifically, in the period B indicated as "B" in FIG. 2D, such a voltage waveform indicated by the thick dotted line as is obtained by shifting the voltage Vpzt indicated by the thin dotted line corresponding to the electromotive force of the piezoelectric element 108c toward the negative side appears between the first electrode 108a and the second electrode 108b. The reason that such a phenomenon occurs will be described later. In the period C indicated as "C" in FIG. 2D, there appears such a voltage waveform indicated by the thick dotted line as is obtained by shifting the waveform of the voltage Vpzt corresponding to the electromotive force of the piezoelectric element 108c toward the positive side. Similarly, thereafter, in each of the period D, the period E, the period F, and so on, there appears such a voltage waveform indicated by the thick dotted line as is obtained by shifting the waveform of the voltage Vpzt corresponding to the electromotive force of the piezoelectric element 108c toward the positive side or the negative side. In the part (the part indicated by hatching in FIG. 2D) where the voltage waveform thus shifted exceeds the sum of VC1 and 2Vf, the charge generated in the piezoelectric element 108c can be stored in the capacitor C1. As a result of the flow of the charge from the piezoelectric element 108c to the capacitor C1, the voltage Vgen between the first electrode 108a and the second electrode 108b is clipped at the voltage corresponding to the sum of VC1 and 2Vf. As a result, the waveform indicated by the thick solid line in FIG. 2D is obtained as the voltage waveform of the voltage between the first electrode 108a and the second electrode 108b.

As is obvious from the comparison between the case of keeping the switch SW in the OFF state shown in FIG. 2B and the case of setting the switch SW to the ON state at the timing when the deformation direction of the beam 104 is switched as shown in FIG. 2D, in the power generation unit 100 according to the present embodiment, it becomes possible to efficiently store the charge in the capacitor C1 by setting the switch SW to the ON state at appropriate timings. Therefore, the power generation unit 100 according to the first embodiment is provided with the controlling piezoelectric device 110 in order to set the switch SW to the ON state at appropriate timings, and detects the current generated in the piezoelectric device 110 to control the switch SW. This point will be explained later in detail.

If the charge is stored in the capacitor C1 and the inter-terminal voltage of the capacitor C1 increases, the shift amount of the voltage waveform also increases in accordance therewith. For example, in comparison between the period B (the state in which no charge is stored in the capacitor C1) in FIG. 2D and the period H (the state in which the charge is stored a little bit in the capacitor C1) in FIG. 2D, the shift amount of the voltage waveform is larger in the period H. Similarly, in comparison between the period C and the period I in FIG. 2D, the shift amount of the voltage waveform is larger in the period I in which the charge stored in the capacitor C1 is increased. Although the reason why such a phenomenon occurs will be described later, as a result, in the power generation unit 100 according to the present embodiment, it becomes also possible to store the voltage higher than the voltage Vpzt, which is generated between the first electrode 108a and the second electrode 108b by deforming the piezoelectric element 108c, in the capacitor C1. As a result, it becomes unnecessary to provide an additional step-up circuit, and thus it becomes possible to obtain a small-sized and highly efficient power generation unit.

A-3. Operation Principle of Power Generation Unit

Figure 3A:
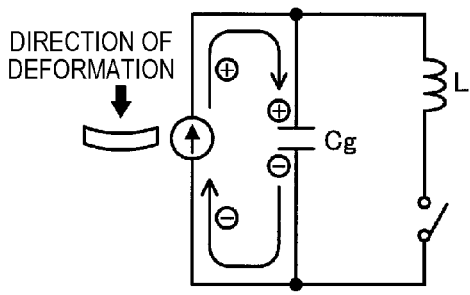
FIGS. 3A through 3F are explanatory diagrams conceptually showing an anterior half of the operation principle of the power generation unit according to the first embodiment.

FIGS. 3A through 3F are explanatory diagrams conceptually showing an anterior half of the operation principle of the power generation unit 100 according to the present embodiment. FIGS. 4A through 4F are explanatory diagrams conceptually showing a posterior half of the operation principle of the power generation unit 100 according to the present embodiment. FIGS. 3A through 3F conceptually show the movement of the charge in the capacitor Cg when setting the switch SW1 to the ON state in accordance with the deformation of the piezoelectric element 108c. FIG. 3A shows the state in which the piezoelectric element 108c (the beam 104, to be precise) is deformed upward (so that the upper surface side has a concave shape). If the piezoelectric element 108c is deformed upward, the current in the positive direction flows from the current source, then the charge is stored in the capacitor Cg, and the voltage in the positive direction is generated between the terminals of the piezoelectric element 108c. The voltage value increases as the deformation of the piezoelectric element 108c increases. The switch SW is set to the ON state at the timing (the timing at which the amount of the charge reaches a peak; see FIG. 3B) at which the deformation of the piezoelectric element 108c reaches a peak.

Figure 3F:
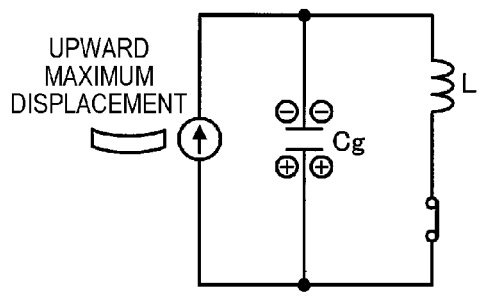
Figure 3F:
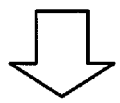
Figure 3F:
Figure 3B:
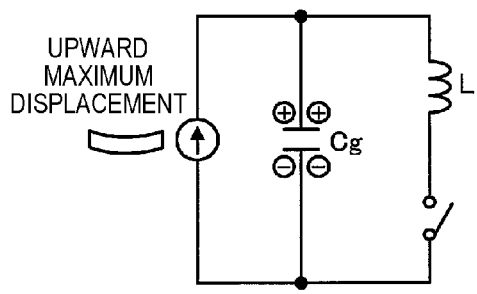
Figure 3E:
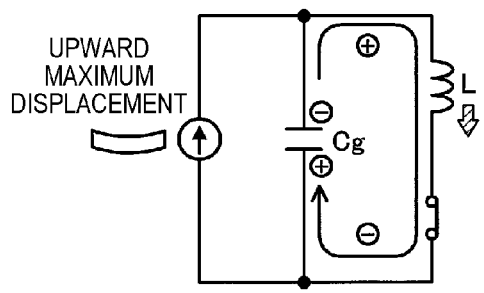
Figure 3E:
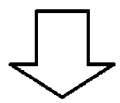
Figure 3E:
Figure 3C:
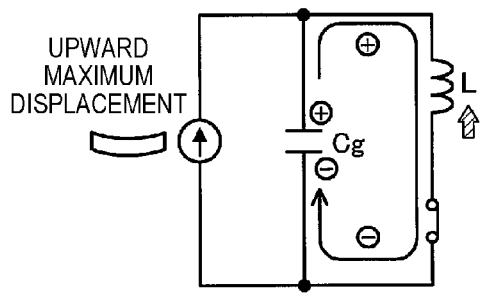

FIG. 3C shows the state immediately after setting the switch SW to the ON state. Since the charge is stored in the capacitor Cg, the charge is urged to flow into the inductor L. Although a magnetic flux is generated (the magnetic flux increases) when a current flows through the inductor L, the inductor L has a nature (a self-induction effect) of generating a back electromotive force in the direction of preventing the change in the magnetic flux penetrating the inductor itself. Since the magnetic flux is urged to increase due to the charge flowing therethrough when the switch SW is set to the ON state, the back electromotive force occurs in the direction (in other words, the direction of hindering the flow of the charge) of preventing the magnetic flux from increasing. The level of the back electromotive force is proportional to the variation rate (the variation per unit time) of the magnetic flux. In FIG. 3C, the back electromotive force generated in the inductor L in such a manner as described above is indicated by the arrow provided with hatching. Since such a back electromotive force is generated, only a little amount of the charge in the piezoelectric element 108c flows out when setting the switch SW to the ON state. In other words, the current flowing through the inductor L increases only gradually.

Figure 3D:
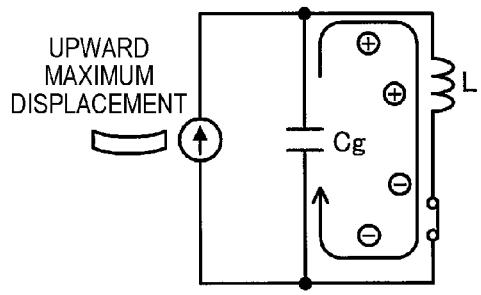
Figure 3D:
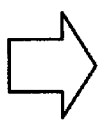

Subsequently, when the current flowing through the inductor L reaches a peak value, the variation rate of the magnetic flux reaches "0," and therefore, the back electromotive force reaches "0" as shown in FIG. 3D. The current starts decreasing in turn. Then, since the magnetic flux penetrating the inductor L decreases, the electromotive force occurs in the inductor L in the direction (the direction of urging the current to flow) of preventing the decrease in the magnetic flux (see FIG. 3E). As a result, the current continues to flow through the inductor L while pulling out the charge from the capacitor Cg due to the electromotive force. If no loss occurs during the migration of the charge, all the charge generated by the deformation of the piezoelectric element 108c is migrated, and there occurs the state (i.e., the state in which the positive charge is distributed on the lower surface side of the piezoelectric element 108c, and the negative charge is distributed on the upper surface side) looked as if the positive and negative charges are replaced with each other. FIG. 3F shows the state in which all the charge generated by the deformation of the piezoelectric element 108c has been migrated.

If the switch SW is kept in the ON state without change, a converse phenomenon to the content described above occurs in turn. Specifically, the positive charge on the lower surface side of the piezoelectric element 108c is urged to flow into the inductor L, and at this moment, the back electromotive force in the direction of hindering the flow of the charge occurs in the inductor L. Subsequently, when the current flowing through the inductor L reaches the peak and then takes a downward turn, the electromotive force in the direction (the direction of urging the current to continue to flow) of preventing the current from decreasing occurs in turn in the inductor L. As a result, there occurs the state (the state shown in FIG. 3B) in which all the positive charge once located on the lower surface side of the piezoelectric element 108c has been migrated to the upper surface side. The positive charge having returned to the upper surface side of the piezoelectric element 108c in this way is migrated again to the lower surface side in such a manner as described above with reference to FIGS. 3B through 3F.

As described above, if the switch SW is set to the ON state in the state in which the charge is stored in the capacitor Cg and is then kept in the ON state, there occurs a kind of resonant phenomenon in which the direction of the current is reversed alternately between the piezoelectric element 108c and the inductor L. The period of the resonant phenomenon corresponds to the resonance period T of the so-called LC resonant circuit, and is therefore obtained by the formula $T=2\pi(LC)^{0.5}$, assuming that the value (capacitance) of the capacitive component Cg included in the piezoelectric element 108c is C, and the value (inductance) of the inductive component of the inductor L is L. Therefore, the time immediately after (the state shown in FIG. 3C) setting the switch SW to the ON state until the state shown in FIG. 3F occurs is obtained as T/2.

Figure 4A:
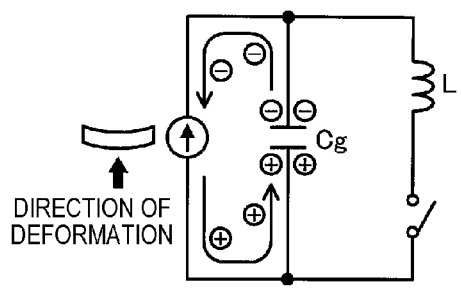
FIGS. 4A through 4F are explanatory diagrams conceptually showing a posterior half of the operation principle of the power generation unit according to the first embodiment.
Figure 4F:
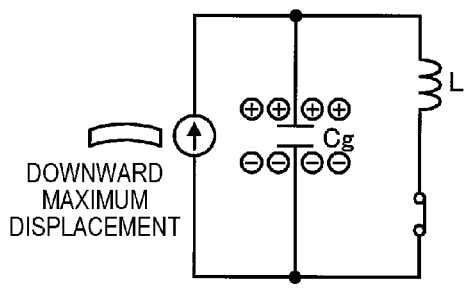
Figure 4B:
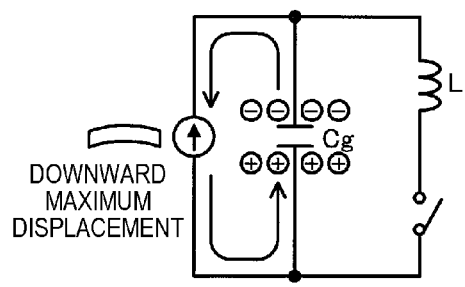
Figure 4E:
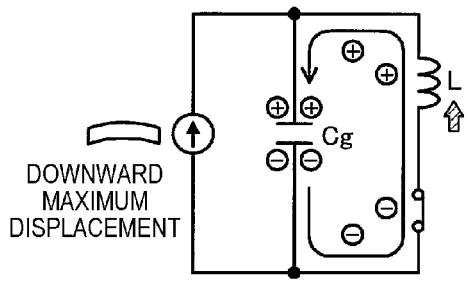
Figure 4C:
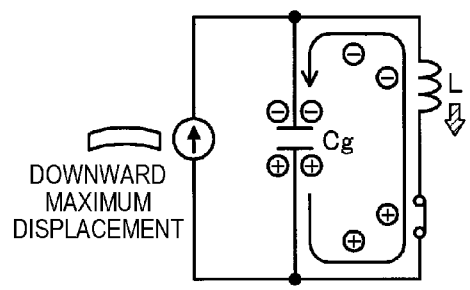
Figure 4D:
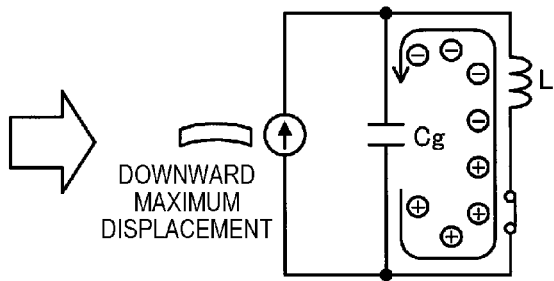

Therefore, the switch SW is set to the OFF state as shown in FIG. 4A at the time point when T/2 has elapsed after setting the switch SW to the ON state. Then, the piezoelectric element 108c (the beam 104, to be precise) is in turn deformed downward (so that the lower surface side has a concave shape) in the present state. Although the piezoelectric element 108c is deformed upward in FIG. 3A described above, since the piezoelectric element 108c is deformed downward in FIG. 4A, the current flows from the current source in the negative direction, and the charge is stored in the capacitor Cg so that the voltage between the terminals of the piezoelectric element 108c increases toward the negative side. Since the positive charge is distributed on the lower surface side of the piezoelectric element 108c and the negative charge is distributed on the upper surface side thereof in the stage prior to deforming the piezoelectric element 108c (the beam 104, to be precise) downward as described above with reference to FIGS. 3A through 3F, it results that a new positive charge is stored on the lower surface side and a new negative charge is stored on the upper surface side in addition to these charges. FIG. 4B shows the state in which the new charges are stored in the piezoelectric element 108c by deforming the piezoelectric element 108c (the beam 104, to be precise) in the state of setting the switch SW to the OFF state.

When setting the switch SW to the ON state in this state, the positive charge stored on the lower surface side of the piezoelectric element 108c is urged to flow into the inductor L. At this moment, since the back electromotive force occurs in the inductor L (see FIG. 4C), the current starts flowing gradually, and eventually reaches the peak, and then makes a downward turn. Then, the electromotive force occurs in the inductor L in the direction (the direction of urging the current to continue to flow) of preventing the current from decreasing (see FIG. 4E), and the current continues to flow due to the electromotive force. Eventually, there occurs the state in which all the positive charge once distributed on the lower surface side of the piezoelectric element 108c has been migrated to the upper surface side, and all the negative charge once distributed on the upper surface side thereof has been migrated to the lower surface side (see FIG. 4F). The time necessary for migrating all the positive charge on the lower surface side to the upper surface side and migrating all the negative charge on the upper surface side to the lower surface side is equal to the time T/2 corresponding to a half of the resonance period T of the LC resonant circuit. Therefore, by setting the switch SW to the OFF state when the time T/2 has elapsed after setting the switch SW to the ON state, and then deforming in turn the piezoelectric element 108c (the beam 104, to be precise) upward (so that the upper surface side has a concave shape), the positive and negative charges can further be stored in the piezoelectric element 108c.

As explained hereinabove, in the power generation unit 100 according to the present embodiment, by deforming the piezoelectric element 108c to thereby generate the charge, and then connecting the piezoelectric element 108c to the inductor L to thereby form the resonant circuit for a half cycle of the resonance period T, the distributions of the positive and negative charges in the piezoelectric element 108c are reversed. Subsequently, the piezoelectric element 108c is in turn deformed in the opposite direction to thereby generate new charges. Since the distributions of the positive and negative charges in the piezoelectric element 108c have been reversed, it results that the charges newly generated are stored in the piezoelectric element 108c. Subsequently, the piezoelectric element 108c is connected again to the inductor L for a half cycle of the resonance period T to thereby reverse the distributions of the positive and negative charges in the piezoelectric element 108c, and then the piezoelectric element 108c is deformed in the opposite direction. By repeating such operations, it is possible to increase the charge stored in the piezoelectric element 108c every time the piezoelectric element 108c is deformed in a repeated manner.

As described above with reference to FIGS. 2A through 2D, in the power generation unit 100 according to the present embodiment, the peculiar phenomenon of shifting the waveform of the voltage generated between the first electrode 108a and the second electrode 108b occurs every time the switch SW is set to the ON state, and this phenomenon occurs due to the following mechanism. That is, in the period A shown in FIG. 2D, for example, although the voltage is generated between the first electrode 108a and the second electrode 108b in accordance with the deformation of the piezoelectric element 108c (the beam 104, to be precise), since the first electrode 108a and the second electrode 108b are connected to the rectifier 120, the charge corresponding to the part exceeding the voltage of the sum of VC1 and 2Vf flows into the capacitor C1 connected to the rectifier 120. As a result, when setting the switch SW to the ON state at the time point when the deformation of the beam 104 reaches the peak, the positive and negative charges remaining in the piezoelectric element 108c at that moment are migrated via the inductor L, and the locations of the positive and negative charges in the piezoelectric element 108c are replaced with each other.

When deforming the beam 104 in the opposite direction in the state in which the locations of the positive and negative charges are replaced with each other, the voltage waveform due to the piezoelectric effect appears between the first electrode 108a and the second electrode 108b of the piezoelectric element 108c. In other words, it results that the voltage variation due to the deformation of the piezoelectric element 108c occurs in the state in which the polarities of the first electrode 108a and the second electrode 108b of the piezoelectric element 108c are replaced with each other. As a result, there appears in the period B shown in FIG. 2D the voltage waveform looked as if the voltage waveform generated in the piezoelectric element 108c due to the deformation of the beam 104 is shifted. However, as described above, since the charge corresponding to the part exceeding the voltage of the sum of VC1 and 2Vf flows into the capacitor C1, the voltage between the first electrode 108a and the second electrode 108b of the piezoelectric element 108c is clipped at the voltage of the sum of VC1 and 2Vf. Subsequently, when setting the switch SW to the ON state for the time half as long as the resonance period T, the locations of the positive and negative charges remaining in the piezoelectric element 108c are replaced with each other. By the deformation of the beam 104 starting from that state, the voltage waveform due to the piezoelectric effect appears in the piezoelectric element 108c. Therefore, it results that there appears also in the period C shown in FIG. 2D the voltage waveform looked as if the voltage waveform due to the deformation of the beam 104 is shifted.

As described above with reference to FIGS. 2A through 2D, in the power generation unit 100 according to the present embodiment, there also occurs the phenomenon that the shift amount of the voltage waveform gradually increases while the beam 104 repeats the deformation. Therefore, there can be obtained a significant advantage that the voltage higher than the electrical potential difference caused between the first electrode 108a and the second electrode 108b due to the piezoelectric effect of the piezoelectric element 108c can be stored in the capacitor C1. Such a phenomenon is caused by the following mechanism.

Firstly, as shown in the period A or the period B in FIG. 2D, in the case in which the capacitor C1 has not been charged, since the charge flows from the piezoelectric element 108c into the capacitor C1 when the voltage generated between the terminals of the piezoelectric element 108c exceeds 2Vf of the rectifier 120, the voltage appearing between the first electrode 108a and the second electrode 108b is clipped at 2Vf. However, as the charges are stored in the capacitor C1 in such a manner as described above, the voltage between the terminals of the capacitor C1 increases. Then, thereafter, the charge does not flow into the capacitor C1 from the piezoelectric element 108c until the voltage between the first electrode 108a and the second electrode 108b reaches a voltage higher than the sum of VC1 and 2Vf. Therefore, the value at which the voltage between the first electrode 108a and the second electrode 108b is clipped rises gradually as the charges are stored in the capacitor C1.

In addition, as described above with reference to FIGS. 3A through 3F and 4A through 4F, on the condition that the charge is prevented from flowing out from the piezoelectric element 108c, the charges in the piezoelectric element 108c continue to increase every time the piezoelectric element 108c (the beam 104, to be precise) is deformed, and the voltage between the first electrode 108a and the second electrode 108b rises in conjunction therewith. Therefore, if the loss of the charge when flowing through the inductor L and the switch SW is not considered, it is possible to increase the voltage between the first electrode 108a and the second electrode 108b. Therefore, according to the power generation unit 100 of the present embodiment, it becomes possible to generate the electrical power in the condition in which the voltage is automatically raised to the voltage necessary to drive the electrical load without providing an additional step-up circuit.

A-4. Switching Timing of Switch

As explained hereinabove, in the power generation unit 100 according to the present embodiment, by applying the cyclic deformation to the piezoelectric element 108c (the beam 104, to be precise), and connecting the piezoelectric element 108c to the inductor L for a period of time half as long as the resonance period T at the timing at which the deformation direction is switched, it is possible to obtain an excellent feature that the charge can efficiently be stored in the capacitor C1, and in addition, miniaturization can easily be achieved because no step-up circuit is required. However, due to the circumstances of the operation speed of the control section 130 and the switch SW, the timing at which the control section 130 sets the switch SW to the ON state does not necessarily coincide completely with the timing at which the deformation direction of the beam 104 is switched. However, it is possible to step-up the voltage Vgen generated between the first electrode 108a and the second electrode 108b by setting the switch SW to the ON state for the period of time half as long as the resonance period T of the LC resonant circuit with a period coinciding with the characteristic vibration period of the beam 104 even if the timing at which the switch SW is set to the ON state does not completely coincide with the timing at which the deformation direction of the beam 104 is switched. Hereinafter, the reason therefor will be explained.

Figure 5A:
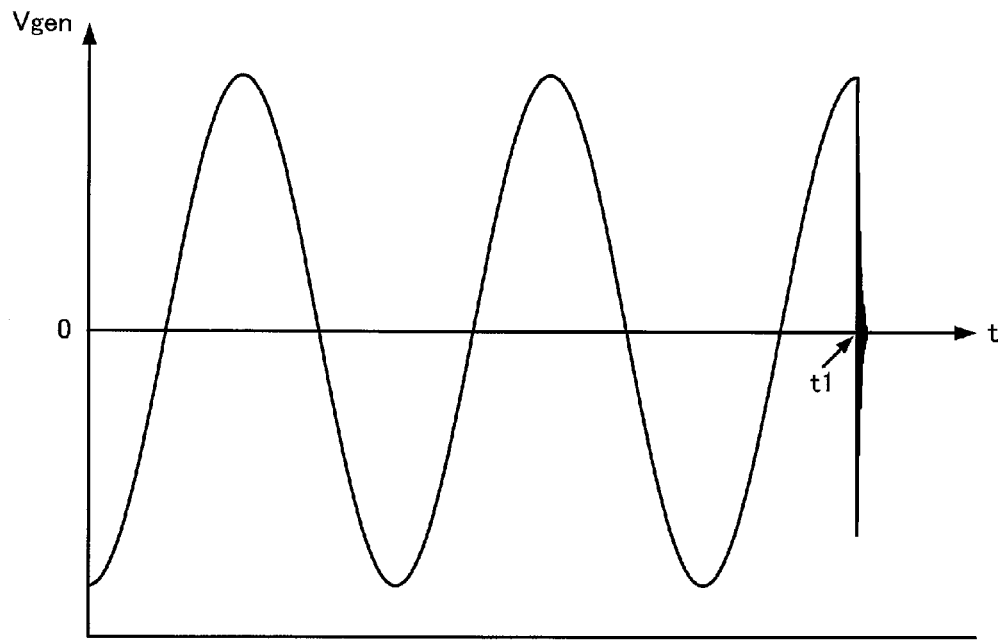
FIG. 5A is an explanatory diagram showing the reason that it is possible to raise the voltage between terminals of a piezoelectric element even if a switch is set to the ON state at an arbitrary timing.
Figure 5B:
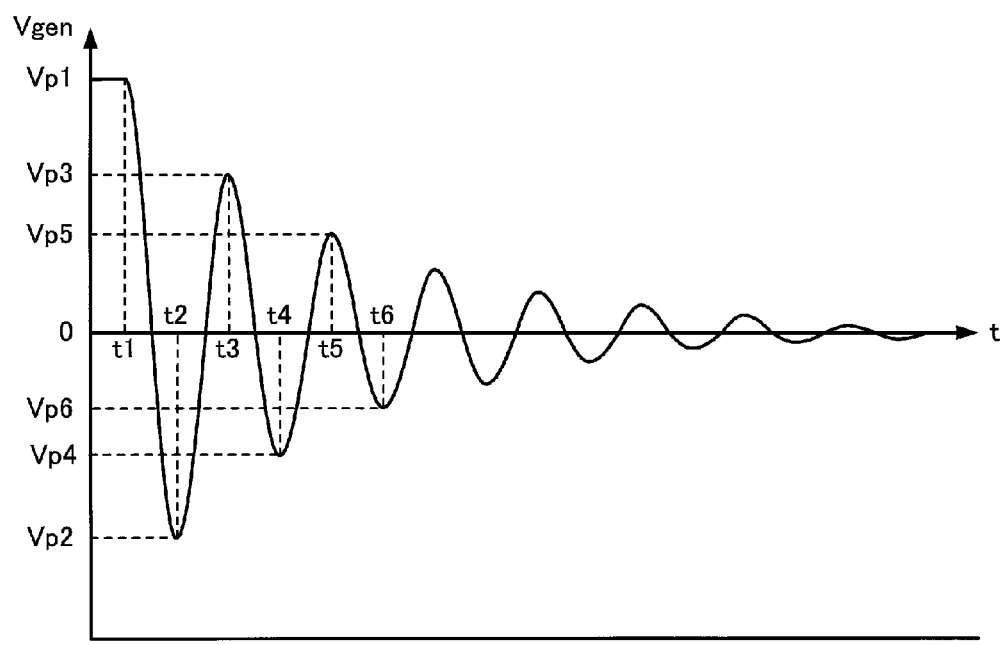
FIG. 5B is an explanatory diagram showing the reason that it is possible to raise the voltage between the terminals of the piezoelectric element even if the switch is set to the ON state at an arbitrary timing.

FIG. 5A shows the state of the voltage Vgen generated between the first electrode 108a and the second electrode 108b if the switch SW is not set to the OFF state after setting the switch SW to the ON state at the time point t1 at which the deformation direction of the beam 104 is switched. FIG. 5B is a diagram obtained by enlarging a part of the waveform shown in FIG. 5A on and after the time point t1. It is assumed in the example shown in FIGS. 5A and 5B that the rectifier 120 and the capacitor C1 are eliminated.

At the time point t1, the voltage Vgen has a peak, and by setting the switch SW to the ON state, the voltage Vgen is attenuated while alternately showing positive and negative peak values Vp1, Vp2, Vp3, Vp4, Vp5, Vp6, . . . with a period (the time points t1, t2, t3, t4, t5, t6, . . . ) half as long as the resonance period T of the LC resonant circuit. If the switch SW is set to the OFF state at the time point t2 when T/2 has elapsed from the time point t1, the shift amount of the voltage Vgen described above is obtained as the sum (|Vp1|+|Vp2|) of the absolute value of Vp1 and the absolute value of Vp2. As explained with reference to FIGS. 3A through 3F, and 4A through 4F, since Vp2 is a voltage value when the positive and negative charges of the capacitive component Cg are replaced with each other by resonance of the LC resonance circuit, the larger the absolute value of Vp1 is, the larger the absolute value of Vp2 becomes. Therefore, the larger the absolute value of Vp1 is, the larger the shift amount of the voltage Vgen becomes.

Figure 6:
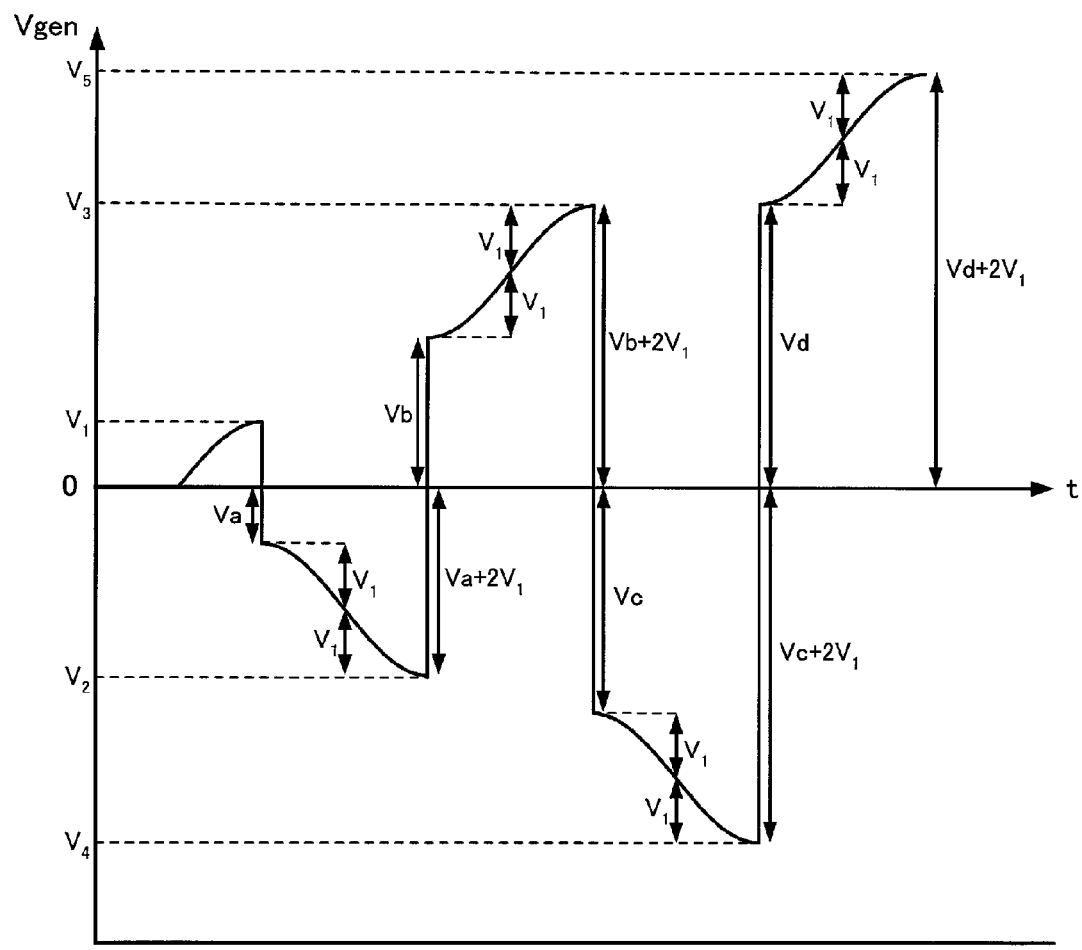
FIG. 6 is an explanatory diagram showing the reason that it is possible to raise the voltage between the terminals of the piezoelectric element even if the switch is set to the ON state at an arbitrary timing.

FIG. 6 shows the state of the voltage Vgen generated between the first electrode 108a and the second electrode 108b in the case in which the switch SW is set to the ON state only for the period of T/2 every time the deformation direction of the beam 104 is switched. It is assumed in also the example shown in FIG. 6 that the rectifier 120 and the capacitor C1 are eliminated. Assuming that the amplitude of the voltage Vpzt due to the electromotive force generated by the piezoelectric element 108c is constant, if the switch SW is set to the ON state for the period of T/2 at the timing at which the voltage Vgen first reaches the voltage value $V_1$ as a positive peak value, the voltage Vgen is shifted $V_1$+Va toward the negative side. Then, the voltage value $V_2$ of Vgen when the second time the switch SW is set to the ON state is $V_2$=−(Va+2$V_1$), and if the switch SW is set to the ON state for the period of T/2, the voltage Vgen is shifted Vb+Va+2$V_1$ toward the positive side. Similarly, the voltage value $V_3$ of Vgen when the third time the switch SW is set to the ON state is $V_3$=Vb+2$V_1$, and if the switch SW is set to the ON state for the period of T/2, the voltage Vgen is shifted Vc+Vb+2$V_1$ toward the negative side. Similarly, the voltage value $V_4$ of Vgen when the fourth time the switch SW is set to the ON state is $V_4$=−(Vc+2$V_1$), and if the switch SW is set to the ON state for the period of T/2, the voltage Vgen is shifted Vd+Vc+2$V_1$ toward the positive side. Similarly, the voltage value $V_5$ of Vgen when the fifth time the switch SW is set to the ON state is $V_5$=Vd+2$V_1$. Here, since the voltage value $V_2$ is obtained as $V_2$=−(Va+2$V_1$), |$V_2$|>|$V_1$| is obviously true. Since the reference symbols $V_1$, $V_2$ denote the voltage values corresponding to the voltage value Vp1 shown in FIG. 5B, and the reference symbols Va, Vb denote the voltage values corresponding to the voltage value Vp2 shown in FIG. 5B, and |$V_2$|>|$V_1$| is true, Vb>Va is necessarily fulfilled. Therefore, since $V_2$ is obtained as $V_2$=−(Va+2$V_1$), $V_3$ is obtained as $V_3$=Vb+2$V_1$, and Vb>Va is true, |$V_3$|>|$V_2$| is true. Similarly, since |$V_3$|>|$V_2$| is true, Vc>Vb is necessarily fulfilled, and since $V_3$=Vb+2$V_1$, $V_4$=−(Vc+2$V_1$) are obtained, and Vc>Vb is true, |$V_4$|>|$V_3$| is true. Similarly, since |$V_4$|>|$V_3$| is true, Vd>Vc is necessarily fulfilled, and since $V_4$=−(Vc+2$V_1$), $V_5$=Vd+2$V_1$ are obtained, and Vd>Vc is true, |$V_5$|>|$V_4$| is true. In essence, by setting the switch SW to the ON state for the period of T/2 at the timing at which the deformation direction of the beam 104 is switched, the absolute value of the voltage Vgen generated between the first electrode 108a and the second electrode 108b is stepped up in such a manner as |$V_1$|<|$V_2$|<|$V_3$|<|$V_4$|<|$V_5$|< . . . .

Figure 7A:
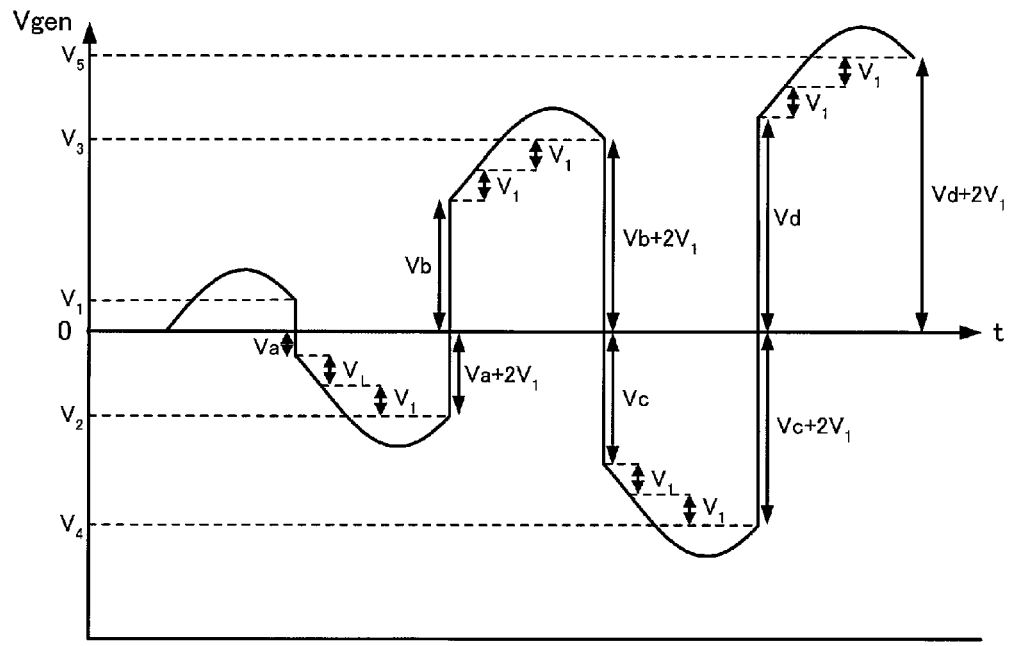
FIG. 7A is an explanatory diagram showing the reason that it is possible to raise the voltage between the terminals of the piezoelectric element even if the switch is set to the ON state at an arbitrary timing.
Figure 7B:
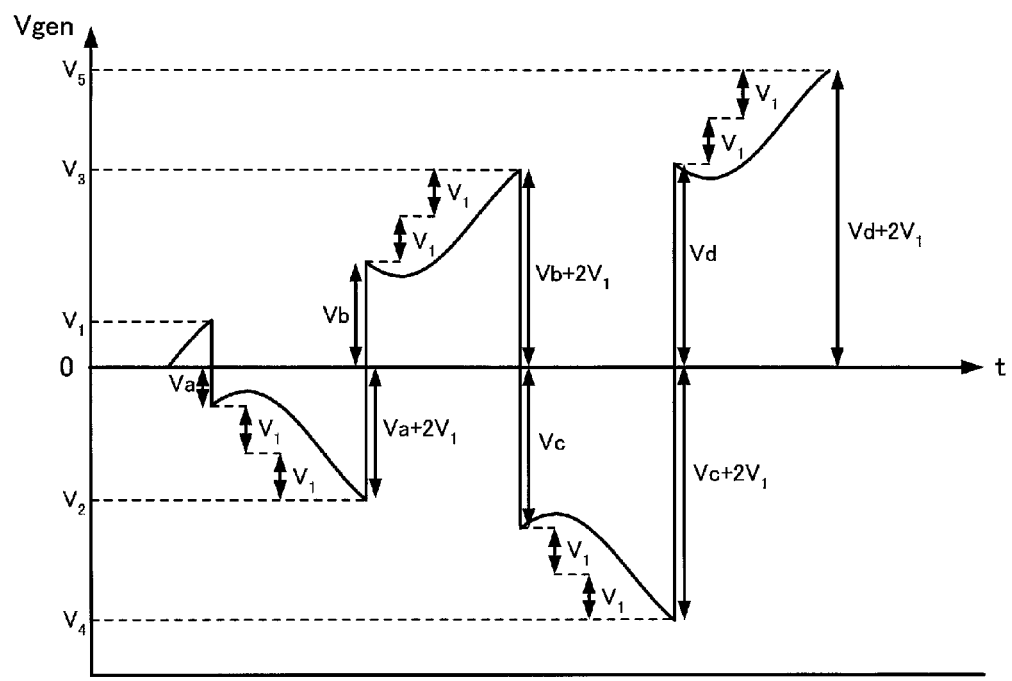
FIG. 7B is an explanatory diagram showing the reason that it is possible to raise the voltage between the terminals of the piezoelectric element even if the switch is set to the ON state at an arbitrary timing.

The same can be applied to the case in which the timing of switching the deformation direction of the beam 104 and the timing of setting the switch SW to the ON state are shifted from each other. FIG. 7A shows the state of the voltage Vgen generated between the first electrode 108a and the second electrode 108b in the case in which the switch SW is set to the ON state for the period of T/2 after the timing at which the deformation direction of the beam 104 is switched, and FIG. 7B shows the state of the voltage Vgen generated between the first electrode 108a and the second electrode 108b in the case in which the switch SW is set to the ON state for the period of T/2 prior to the timing at which the deformation direction of the beam 104 is switched. It is assumed in also the examples shown in FIGS. 7A and 7B that the rectifier 120 and the capacitor C1 are eliminated.

In the examples shown in FIGS. 7A and 7B, similarly to the example shown in FIG. 6, the voltage Vgen takes the voltage value $V_2$=−(Va+2$V_1$) when the second time the switch SW is set to the ON state with respect to the voltage value $V_1$ when the switch SW is first set to the ON state, the voltage value $V_3$=Vb+2$V_1$ when the third time the switch SW is set to the ON state, the voltage value $V_4$=−(Vc+2$V_1$) when the fourth time the switch SW is set to the ON state, the voltage value $V_5$=Vd+2$V_1$ when the fifth time the switch SW is set to the ON state, and so on. Here, since the voltage values $V_2$, $V_3$, $V_4$, $V_5$, . . . are expressed by the same formulas as those of the voltage values $V_2$, $V_3$, $V_4$, $V_5$, . . . in the case of FIG. 6, the conditions $V_2$>$V_1$, $V_3$>$V_2$, $V_4$>$V_3$, $V_5$>$V_4$, . . . are also fulfilled. Therefore, also in the case in which the switch SW is set to the ON state for the period of T/2 at the timing shifted before or after the timing at which the deformation direction of the beam 104 is switched, the voltage Vgen is stepped up in such a manner as |$V_1$|<|$V_2$|<|$V_3$|<|$V_4$|<|$V_5$|< . . . . It should be noted that since the higher the voltage value $V_1$ is, the larger the voltage values Va, Vb, Vc, Vd, . . . become, the rate of stepping up the voltage Vgen is higher and the power generation efficiency is higher in the example shown in FIG. 6 than in the examples shown in FIGS. 7A and 7B.

In the case (the case of $V_1=0$ in FIGS. 7A and 7B) in which the switch SW is set to the ON state for the period of T/2 at the timing at which the displacement of the beam 104 vanishes (the voltage Vgen reaches 0), the resonance of the LC resonant circuit fails to occur, and the voltage Vgen does not rise.

As explained hereinabove, even if the switch SW is set to the ON state at an arbitrary timing (it should be noted that the timing at which the displacement of the beam 104 vanishes (the voltage Vgen is equal to 0) is excepted), the voltage generated between the first electrode 108a and the second electrode 108b can be stepped up by setting the switch SW to the ON state for the period half as long as the resonance period T of the LC resonant circuit.

Figure 8:
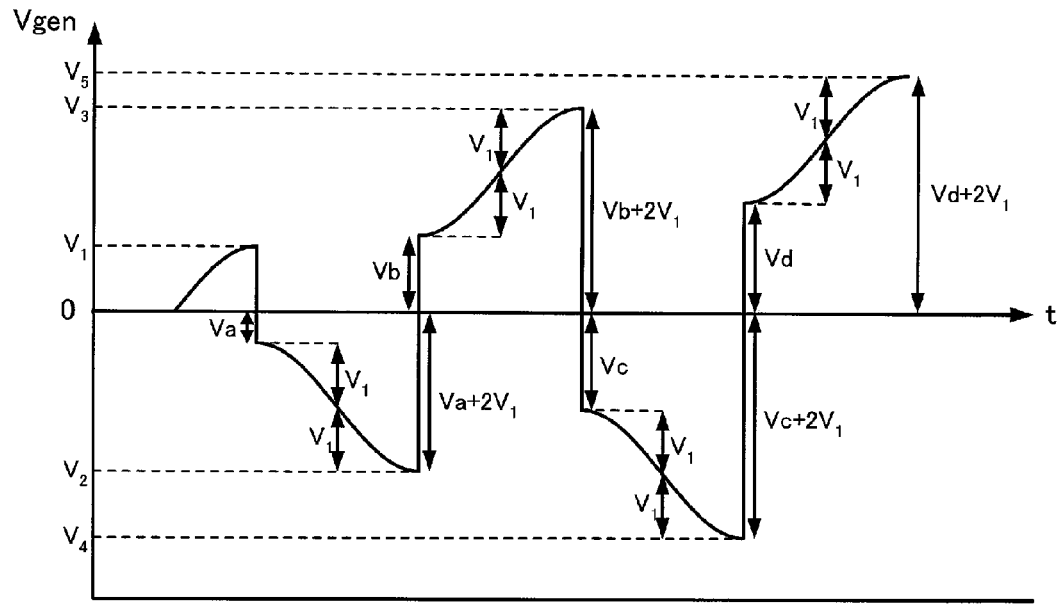
FIG. 8 is a diagram showing a voltage waveform between the terminals of the piezoelectric element in the case of setting the switch to the ON state for a period of time three halves as long as the resonance period of an LC resonant circuit.

Although it is preferable to set the switch SW to the ON state only for the period half as long as the resonance period T of the LC resonant circuit in order to improve the power generation efficiency, it is possible to at least step up the voltage Vgen generated between the first electrode 108a and the second electrode 108b even by setting the switch SW to the ON state for a predetermined period of time. For example, FIG. 8 shows an example of the voltage Vgen generated between the first electrode 108a and the second electrode 108b in the case in which the switch SW is set to the ON state only for the period three-halves times as long as the resonance period T at the timing at which the deformation direction of the beam 104 is switched. In essence, the case corresponds to the case in which the switch SW is set to the ON state at the time point t1 shown in FIG. 5B, and is then set to the OFF state at the time point t3. It is assumed in also the example shown in FIG. 8 that the rectifier 120 and the capacitor C1 are eliminated.

In the example shown in FIG. 8, similarly to the example shown in FIG. 6, the voltage Vgen takes the voltage value $V_2=-(Va+2V_1)$ when the second time the switch SW is set to the ON state with respect to the voltage value $V_1$ when the switch SW is first set to the ON state, the voltage value $V_3=Vb+2V_1$ when the third time the switch SW is set to the ON state, the voltage value $V_4=-(Vc+2V_1)$ when the fourth time the switch SW is set to the ON state, the voltage value $V_5=Vd+2V_1$ when the fifth time the switch SW is set to the ON state, and so on, and the voltage Vgen is stepped up in such a manner as $|V_1|<|V_2|V_3|<|V_4|<|V_5|<\ldots$. It should be noted that since the higher the voltage value $V_1$ is, the larger the voltage values Va, Vb, Vc, Vd, . . . become, the rate of stepping up the voltage Vgen is higher and the power generation efficiency is higher in the example shown in FIG. 6 than in the example shown in FIG. 8.

Figure 9:
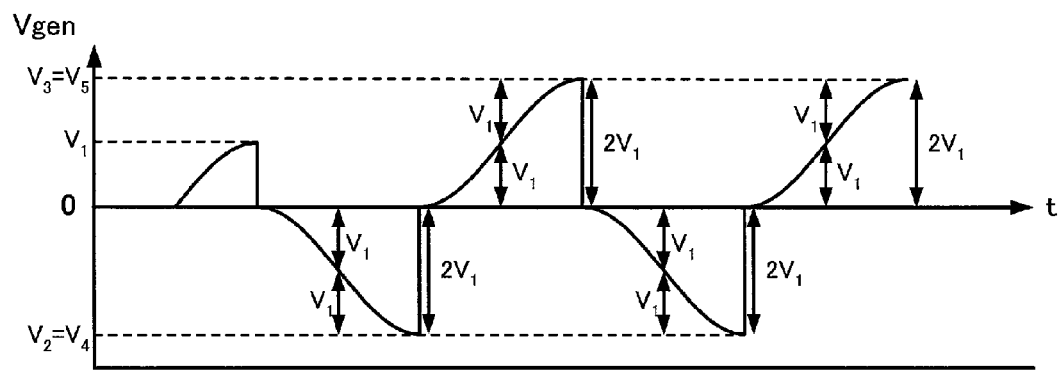
FIG. 9 is a diagram showing a voltage waveform between the terminals of the piezoelectric element in the case of setting the switch to the ON state for a period of time a quarter as long as the resonance period of the LC resonant circuit.

On the other hand, FIG. 9 shows the state of the voltage Vgen generated between the first electrode 108a and the second electrode 108b in the case in which the switch SW is set to the ON state only for a period a quarter as long as the resonance period T at the timing at which the deformation direction of the beam 104 is switched. In essence, the case corresponds to the case in which the switch SW is set to the ON state at the time point t1 shown in FIG. 5B, and is then set to the OFF state at the time point (t1+t2)/2. It is assumed in also the example shown in FIG. 9 that the rectifier 120 and the capacitor C1 are eliminated.

In the example shown in FIG. 9, the voltage Vgen takes the voltage value $V_2=-2V_1$ when the second time the switch SW1 is set to the ON state with respect to the voltage value $V_1$ when the switch SW is first set to the ON state, the voltage value $V_3=2V_1$ when the third time the switch SW is set to the ON state, the voltage value $V_4=-2V_1$ when the fourth time the switch SW is set to the ON state, the voltage value $V_5=2V_1$ when the fifth time the switch SW is set to the ON state, and so on. In other wards, the voltage Vgen can be stepped up to $2V_1$, but is not stepped up to a level exceeding $2V_1$.

Similarly, also in the case of setting the switch SW to the ON state only for the period obtained by multiplying either one of 3/4, 5/4, 7/4, 9/4, . . . by the resonance period T at the timing at which the deformation direction of the beam 104 is switched, the voltage values of $V_2=-2V_1$, $V_3=2V_1$, $V_4=-2V_1$, $V_5=2V_1$, . . . are obtained, and the voltage Vgen can be stepped up to $2V_1$, but is not stepped up beyond $2V_1$.

According to the phenomenon described above, due to the resonance of the LC resonant circuit, by setting the switch SW to the OFF state at least when the polarity of the voltage Vgen is changed to the opposite polarity to the polarity thereof at the time point when the switch SW is set to the ON state, the voltage Vgen continues to rise. In essence, it is possible to efficiently step up the voltage Vgen by setting the predetermined period during which the switch SW is set to the ON state to the period at least longer than $(n+¼)T$ and shorter than $(n+¾)T$ (n denotes an arbitrary integer equal to or greater than 0) with respect to the resonance period T of the LC resonant circuit.

As described above, in the case of setting the switch SW to the ON state only for the period half as long as the resonance period T of the LC resonant circuit, the shift amount when switching the switch SW takes the maximum value, and therefore, the highest power generation efficiency can be obtained. Therefore, in the power generation unit 100 according to the present embodiment, the control section 130 sets the switch SW to the ON state with the period coinciding with the characteristic vibration period of the beam 104, and sets the switch SW to the OFF state when the time half as long as the resonance period T of the LC resonant circuit has elapsed.

However, it is not so easy to set the switch SW to the ON state at the timing at which the deformation direction of the beam 104 is switched. For example, assuming that the magnitude of the displacement of the beam 104 reaches the maximum value at the timing at which the deformation direction of the beam 104 is switched, it is also possible to adopt the configuration of using a mechanical contact which is set to the ON state at the timing at which the beam 104 takes the maximum displacement. However, if the adjustment of the contact fails, it results that the efficiency is dramatically degraded. Therefore, in the power generation unit 100 according to the present embodiment, the current Ipzt2 generated in the piezoelectric device 110 is detected to thereby set the switch SW to the ON state. The timing at which the deformation direction of the piezoelectric device 110 is switched coincides with the timing (the timing at which the current value reaches 0) at which the direction of the current Ipzt2 due to the charge generated by the piezoelectric device 110 is switched. Therefore, by detecting the current Ipzt2 generated in the piezoelectric device 110, the switch SW can easily be set to the ON state (a conductive state) at the timing at which the deformation direction of the beam 104 (the deforming member) is switched.

Figure 10A:
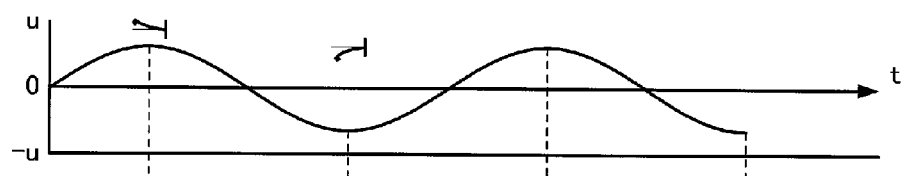
FIGS. 10A through 10C are explanatory diagrams showing the reason that the switch SW can be controlled at an appropriate timing by detecting a current generated in a controlling piezoelectric device.
Figure 10B:
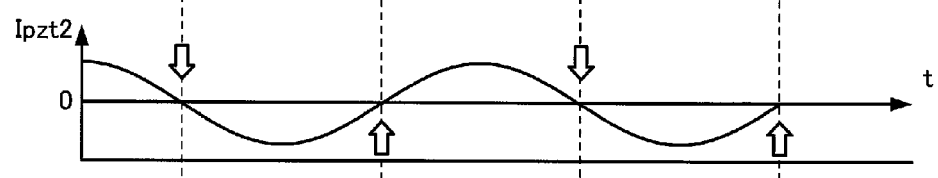
Figure 10C:
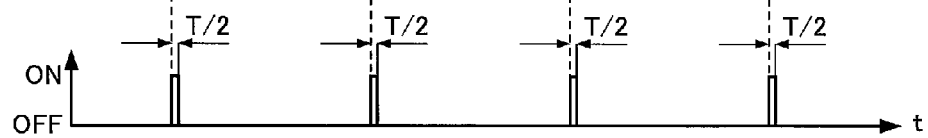

FIGS. 10A through 10C are explanatory diagrams showing the reason that the switch SW can be controlled at an appropriate timing by detecting a current Ipzt2 generated in the controlling piezoelectric device 110. FIG. 10A shows the displacement of the beam 104. FIG. 10B shows how the current Ipzt2 generated in the piezoelectric device 110 varies due to the vibration of the beam 104. FIG. 10C shows the ON/OFF state of the switch SW.

As described above with reference to FIGS. 3A through 3F, 4A through 4F, 5A, 5B, 6, 7A, 7B, 8, and 9, the electrical power can be generated with the highest efficiency in the case of setting the switch SW to the ON state at the timing at which the displacement u of the beam 104 reaches the extreme value. As is obvious from the comparison between FIGS. 10A and 10B, the timing at which the displacement u of the beam 104 takes the extreme value coincides with the timing at which the current Ipzt2 generated in the piezoelectric device 110 vanishes. The reason therefor is that since the piezoelectric device 110 is not connected to the inductor L or the capacitor C1, the variation in the charge is directly reflected on the variation in the current Ipzt2 generated in the piezoelectric device 110.

Therefore, as indicated by the outlined arrow in FIG. 10B, by detecting the timing at which the current Ipzt2 generated in the piezoelectric device 110 reaches 0, and then setting the switch SW to the ON state for only a predetermined period (e.g., the period (T/2) half as long as the resonance period T of the LC resonant circuit described above) starting from that timing, it becomes possible to efficiently generate the electrical power.

Figure 11:
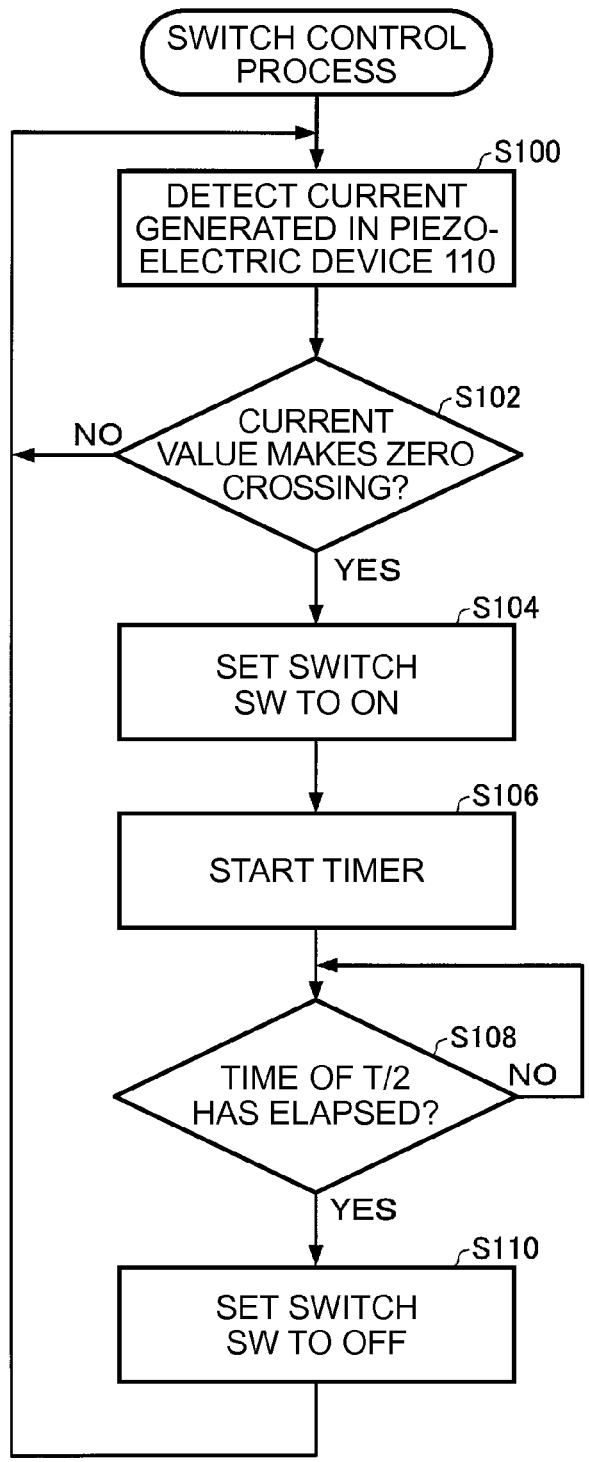
FIG. 11 is a flowchart for explaining a switch control process as an example of a method of controlling the power generation unit according to the embodiment.

FIG. 11 is a flowchart for explaining a switch control process as an example of a method of controlling the power generation unit 100 according to the present embodiment. The method of controlling the power generation unit 100 according to the present embodiment includes the step of detecting the current generated in the piezoelectric device 110, and the step of electrically connecting the piezoelectric device 108 and the inductor L to each other via the switch SW based on the detection result of the current.

In the switch control process shown in FIG. 11, firstly, the control section 130 detects (step S100) the current generated in the piezoelectric device 110. In the present embodiment, the current detect circuit 134 of the control section 130 detects the current flowing in the capacitor 132 to thereby detect the current generated in the piezoelectric device 110. Since the capacitor 132 is connected in parallel to the piezoelectric device 110 as shown in FIG. 1B, the current having the same phase as that of the current generated in the piezoelectric device 110 flows in the capacitor 132. Therefore, by detecting the current flowing in the capacitor 132, the timing (the timing at which the current vanishes) at which the direction of the current due to the charge generated in the piezoelectric device 110 is switched can easily be detected.

Figure 12:
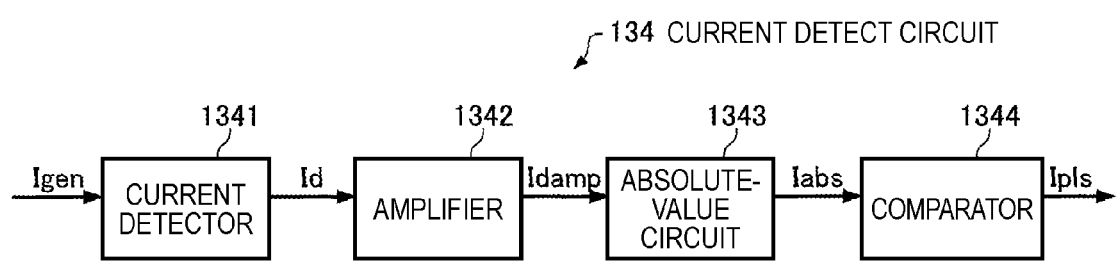
FIG. 12 is a block diagram showing an example of a configuration of a current detect circuit.

FIG. 12 is a block diagram showing an example of a configuration of the current detect circuit 134.

As a current detector 1341, a device known to the public such as a Hall element current sensor or a shunt resistance can be used.

An amplifier 1342 amplifies an output signal (Id) of the current detector 1341 at a predetermined gain. An absolute-value circuit 1343 outputs an absolute value signal of an output signal (Idamp) of the amplifier 1342. The amplifier 1342 and the absolute-value circuit 1343 are not essential circuits, but are added for making it easy for the comparator 1344 to detect presence or absence of the current.

The comparator 1344 binarizes the output signal (Iabs) of the absolute-value circuit 1343 (converts the output signal into pulses), and then outputs the result. At the timing of the falling edge of the output signal (Ipls) of the comparator 1344, the current flowing in the capacitor 132 vanishes. It is also possible to arrange that the state in which a little current flows is detected instead of the state in which no current flows at all. This configuration is adopted for preventing malfunction of the comparator 1344 due to noises when no current flows. If a lot of margin is taken here, the power generation efficiency is degraded due to the shift of the detection timing, and therefore, it is preferable to reduce the noise as much as possible, and perform the detection at the timing at which the current approximates 0.

In the switch control process shown in FIG. 11, after the step S100, whether or not the current value detected in the step S100 has made zero crossing is determined (step S102). In the present embodiment, the control circuit 136 performs the determination in the step S102 based on the output signal (Ipls) of the current detect circuit 134 of the control section 130. In the case (the case in which NO is determined in the step S102) in which zero crossing has not been made, the step S100 and the step S102 are repeated.

If the current value makes the zero crossing (the case of YES in the step S102), the control section 130 switches (step S104) the switch SW to the ON state. In the present embodiment, the control circuit 136 of the control section 130 outputs a control signal to the switch SW to thereby switch the switch SW to the ON state.

After the step S104, the control section 130 starts (step S106) a timer. In the present embodiment, it is possible for the control circuit 136 of the control section 130 to have the timer.

After the step S106, the control section 130 determines (step S108) whether or not the period (T/2) half as long as the resonance period T of the resonant circuit composed of the capacitance component Cg of the piezoelectric device 108 and the inductor L. In the present embodiment, the control circuit 136 of the control section 130 performs the determination in the step S108. If the control circuit 136 determines (the case of NO in the step S108) that the time T/2 has not elapsed, the step S108 is repeated.

If the control circuit 136 determines (the case of YES in the step S108) that the time T/2 has elapsed, the control section 130 switches (step S110) the switch SW to the OFF state. In the present embodiment, the control circuit 136 of the control section 130 outputs a control signal to the switch SW to thereby switch the switch SW to the OFF state. After the step S110, the control section 130 repeats the steps S100 through S110.

By switching between the ON/OFF states of the switch SW in such a manner as described hereinabove, the switch SW can be switched between the ON/OFF states at appropriate timings in accordance with the movement of the beam 104, and therefore, it becomes possible to efficiently generate the electrical power using the power generation unit 100.

Since the switch SW is switched between the ON/OFF states based on the current generated in the piezoelectric device 110, the timing can be determined based on whether or not the current value traverses the reference value instead of whether or not the extreme value of the current value is reached. Therefore, it is possible to accurately determine the timing for switching the switch SW. Thus, the power generation efficiency can be improved.

B. SECOND EMBODIMENT

In the explanation of the power generation unit 100 according to the first embodiment described above, it is assumed that a single controlling piezoelectric device 110 is disposed. However, it is not necessarily required to provide the single controlling piezoelectric device 110, but a plurality of such controlling piezoelectric devices can also be provided. Hereinafter, a second embodiment with such a configuration will be explained. The constituents substantially the same as those of the first embodiment will also be attached with the same reference numerals in the second embodiment, and the detailed explanation therefor will be omitted.

Figure 13A:
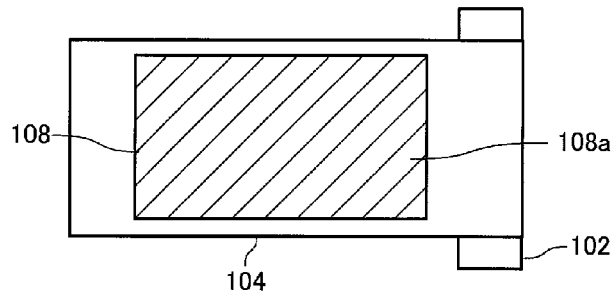
FIG. 13A is an explanatory diagram showing a power generation unit according to a second embodiment provided with a plurality of controlling piezoelectric devices.
Figure 13B:
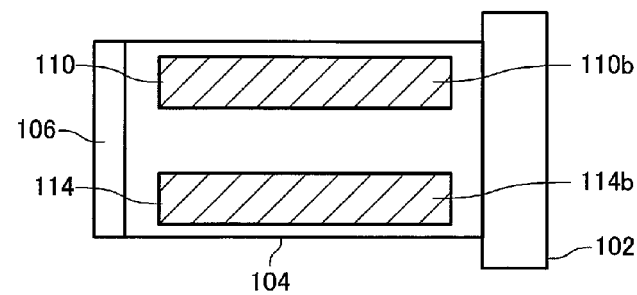
FIG. 13B is an explanatory diagram showing the power generation unit according to the second embodiment provided with the plurality of controlling piezoelectric devices.
Figure 13C:
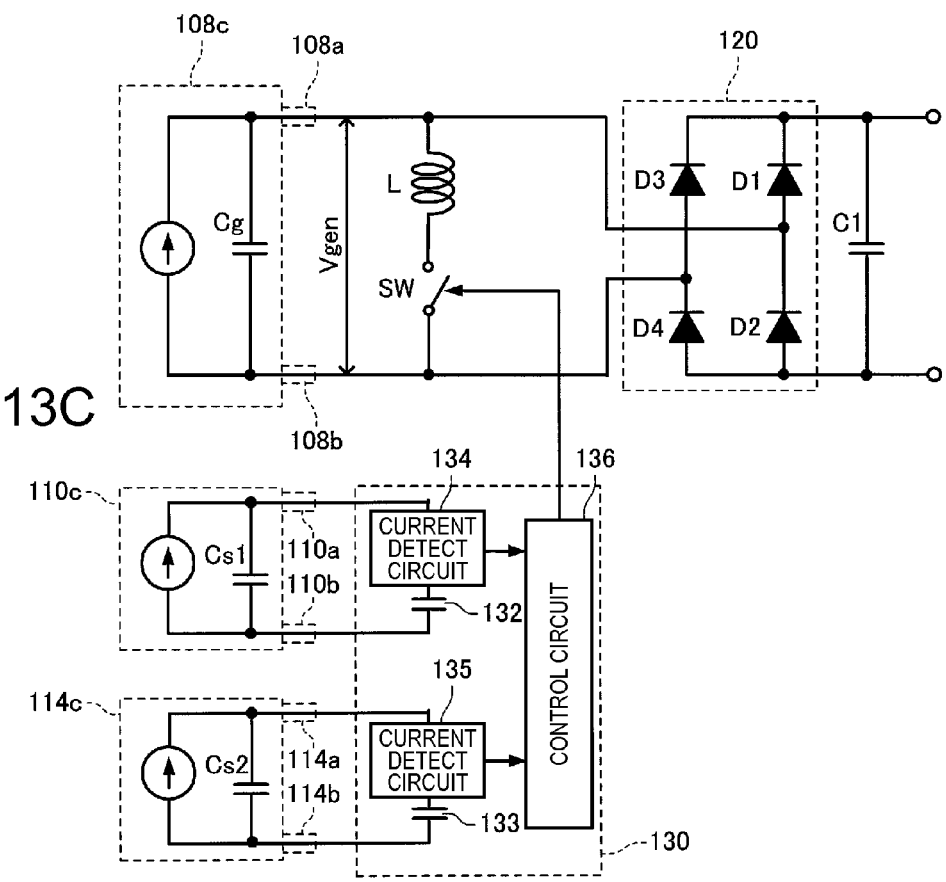
FIG. 13C is an explanatory diagram showing the power generation unit according to the second embodiment provided with the plurality of controlling piezoelectric devices.

FIGS. 13A through 13C are explanatory diagrams showing the power generation unit 100 according to the second embodiment provided with the plurality of controlling piezoelectric devices. FIG. 13A is a plan view thereof viewed from one surface of the beam 104. FIG. 13B is a plan view thereof viewed from the other surface of the beam 104. FIG. 13A shows the power-generating piezoelectric device 108 disposed on the one surface of the beam 104, and FIG. 13B shows two controlling piezoelectric devices (the piezoelectric device 110 and the piezoelectric device 114) disposed on the other surface of the beam 104. As is obvious from the comparison between FIGS. 13A and 13B, the controlling piezoelectric devices 110, 114 have a length (a length in the longitudinal direction of the beam 104) the same as that of the power-generating piezoelectric device 108, but have a width (a length in the direction along the shorter dimension of the beam 104) narrower than a half of that of the power-generating piezoelectric device 108. The two controlling piezoelectric devices 110, 114 are disposed at positions shifted toward both sides of the beam 104 in the width direction thereof. The piezoelectric device 114 is configured including a piezoelectric element 114c formed of a piezoelectric material such as lead zirconium titanate (PZT), and a first electrode (an upper electrode) 114a and a second electrode (a lower electrode) 114b each formed of a metal thin film on the surfaces of the piezoelectric element 114c. The first electrode (the upper electrode) 114a and the second electrode (the lower electrode) 114b are disposed so as to be opposed to each other across the piezoelectric element 114c.

If the power-generating piezoelectric device 108 has the maximum installable length and width with respect to the beam 104, the amount of power generation of the power-generating piezoelectric device 108 becomes large, and if the controlling piezoelectric devices 110, 114 have the minimum installable width (length in the direction along the shorter dimension of the beam 104), the displacement resistance of the beam 104 due to the controlling piezoelectric devices 110, 114 is reduced, and therefore, high power generation efficiency is obtained.

By disposing the two controlling piezoelectric devices 110, 114 at the positions shifted toward the both sides of the beam 104 in the width direction thereof, the controlling piezoelectric devices 110, 114 can set the switch SW to the ON/OFF states at appropriate timings even in the case in which the beam 104 generates the displacement different between the vertical and horizontal positions, and therefore, the power generation unit 100 can be used in a variety of situations.

FIG. 13C shows a circuit diagram of the power generation unit 100 according to the second embodiment provided with the two controlling piezoelectric devices 110, 114. The first controlling piezoelectric device 110 is expressed as a combination of a current source and a capacitor (a capacitance component) Cs1 for storing charges, and the second controlling piezoelectric device 114 is expressed as a combination of a current source and a capacitor (a capacitive component) Cs2 for storing charges. The first electrode 110a and the second electrode 110b of the first controlling piezoelectric device 110 are connected to the control section 130, and the first electrode 114a and the second electrode 114b of the second controlling piezoelectric device 114 are also connected to the control section 130.

In the example shown in FIG. 13C, the control section 130 is configured including the capacitor 132 connected in parallel to the piezoelectric device 110, the current detect circuit 134 for detecting the current flowing to the capacitor 132, a capacitor 133 connected in parallel to the piezoelectric device 114, a current detect circuit 135 for detecting the current flowing to the capacitor 133, and a control circuit 136 for controlling the switch SW based on the current detected at least either one of the current detect circuit 134 and the current detect circuit 135. The current detect circuit 135 can be configured similarly to the current detect circuit 134.

The control section 130 selects either one of a pair of first electrode 110a and the second electrode 110b and a pair of first electrode 114a and the second electrode 114b, and then detects the current generated in the selected one of the piezoelectric device 110 and the piezoelectric device 114 to thereby set the switch SW to the conductive state for a predetermined period of time. For example, the amount of power generation has previously been measured when installing the power generation unit 100 in the case of generating the electrical power while detecting the current generated in the piezoelectric device 110 and in the case of generating the electrical power while detecting the current generated in the piezoelectric device 114. Either one of the cases with a larger amount of power generation has previously been selected using a switch (not shown) or the like provided to the control section 130. If either one of the piezoelectric device 110 and the piezoelectric device 114 has previously been selected in such a manner as described above, by performing the switch control process described above with reference to FIG. 11, the ON/OFF control of the switch SW can be performed.

Although the two piezoelectric devices 110, 114 generate broadly similar current waveforms, a slight difference in current waveform and magnitude of the current amplitude can occur due to the factors such as the structure of the beam 104 and the production tolerance. Further, if the difference occurs in the current waveform, there is a possibility of causing the difference in power generation amount, and if the difference occurs in the magnitude of the current amplitude, there is a possibility of controlling the switch SW at a more appropriate timing when using one of the piezoelectric devices (having higher sensitivity as a sensor) with which a larger current amplitude can be obtained. Therefore, by having previously measured the power generation amount in the case of generating the electrical power while detecting the current generated in the piezoelectric device 110 and in the case of generating the electrical power while detecting the current generated in the piezoelectric device 114, and then selecting one with larger power generation amount, it becomes possible to more efficiently generate the electrical power.

C. THIRD EMBODIMENT

Figure 14:
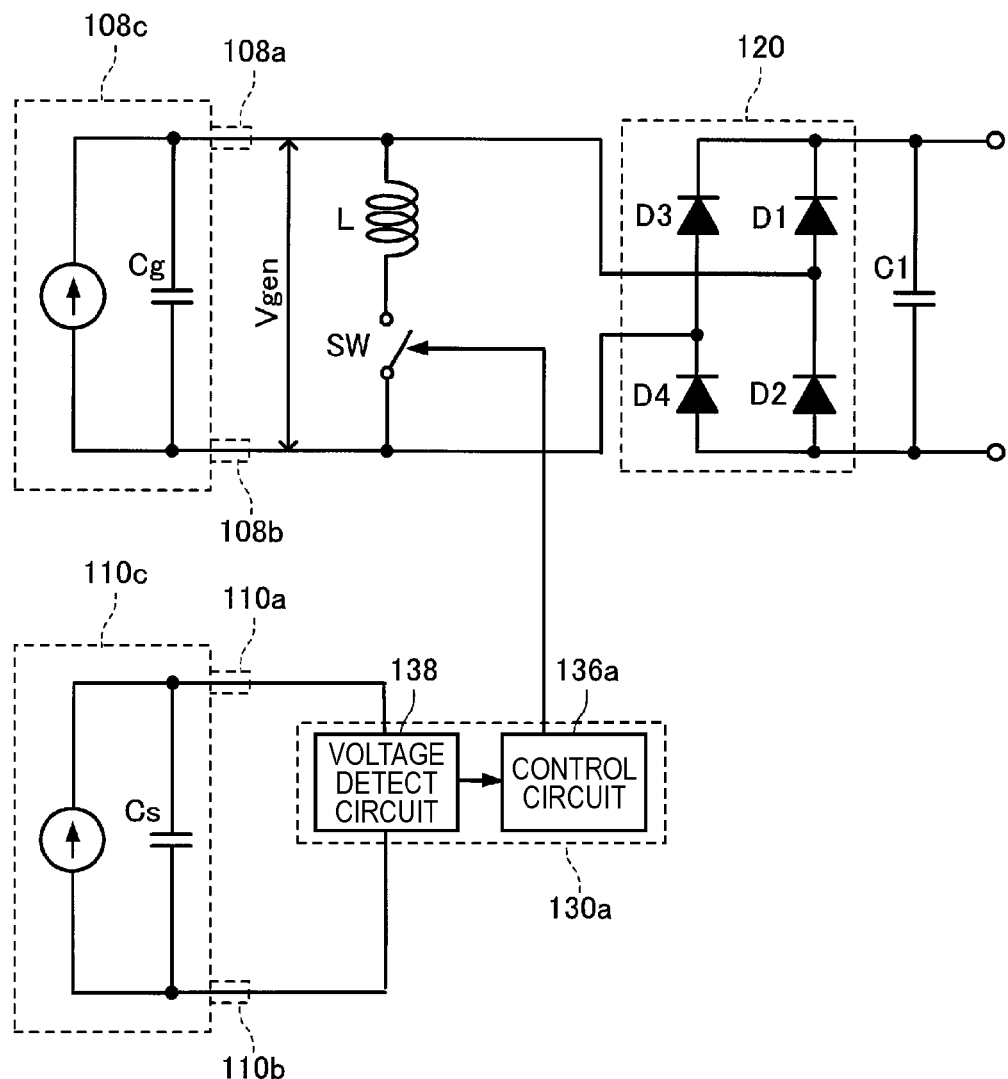
FIG. 14 is a circuit diagram showing an electrical structure of the power generation unit according to a third embodiment.

FIG. 14 is a circuit diagram showing the electrical structure of the power generation unit 100 according to a third embodiment. The mechanical structure of the power generation unit 100 according to the third embodiment is the same as the structure shown in FIG. 1A. The constituents substantially the same as those of the first embodiment will also be attached with the same reference numerals in the third embodiment, and the detailed explanation therefor will be omitted.

In the power generation unit 100 according to the third embodiment, the controlling piezoelectric device 110 is also provided in addition to the power-generating piezoelectric device 108, and the voltage generated in the piezoelectric device 110 is detected to thereby control the switch SW.

The power generation unit 100 according to the third embodiment includes a control section 130a. The control section 130a performs the ON/OFF control of the switch SW. Specifically, the control section 130a detects the voltage generated in the piezoelectric device 110, and if the voltage detected has a value equal to or higher than a predetermined value, the control section 130a sets the switch SW to the conductive state to thereby electrically connect the piezoelectric device 108 and the inductor L to each other via the switch SW. In the present embodiment, the control section 130a is configured including a voltage detect circuit 138 for detecting the voltage generated in the piezoelectric device 110 and a control circuit 136a for controlling the switch SW based on the voltage detected by the voltage detect circuit 138. The control circuit 136a can also be formed of a central processing unit (CPU). Details of the operation of the control section 130a will be described later.

Figure 15A:
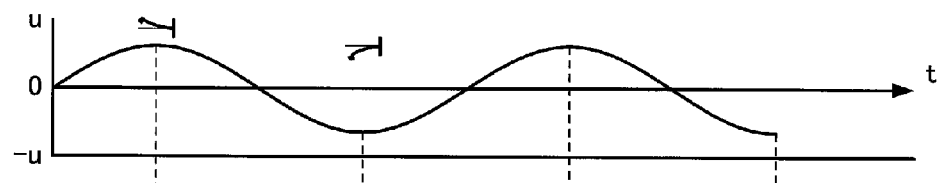
FIGS. 15A through 15C are explanatory diagrams showing the reason that the switch SW can be controlled at an appropriate timing by detecting a voltage generated in a controlling piezoelectric device.
Figure 15B:
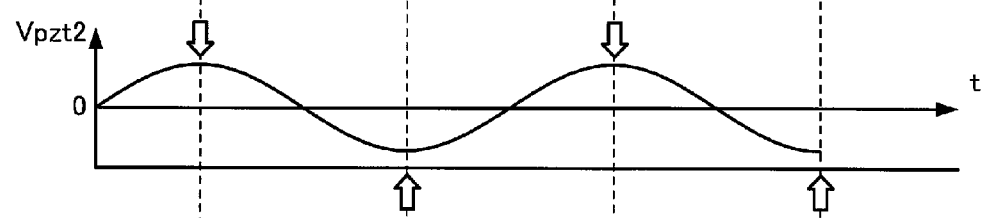
Figure 15C:
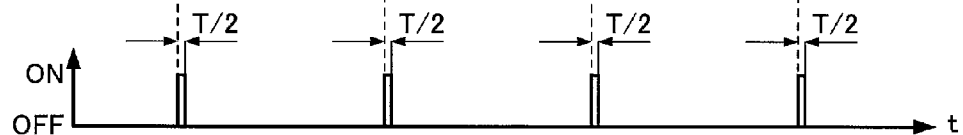

FIGS. 15A through 15C are explanatory diagrams showing the reason that the switch SW can be controlled at an appropriate timing by detecting a voltage generated in the controlling piezoelectric device 110. FIG. 15A shows the displacement of the beam 104. FIG. 15B shows how the electromotive force Vpzt2 generated in the piezoelectric device 110 varies due to the vibration of the beam 104. FIG. 15C shows the ON/OFF state of the switch SW.

As described above with reference to FIGS. 3A through 3F, and 4A through 4F, the electrical power can be generated with the highest efficiency in the case of setting the switch SW to the ON state at the timing at which the displacement u of the beam 104 reaches the extreme value. As is obvious from the comparison between FIGS. 15A and 15B, the timing at which the displacement u of the beam 104 takes the extreme value coincides with the timing at which the electromotive force Vpzt2 of the piezoelectric device 110 has an extreme value. The reason therefor is as follows. Firstly, even if the charge is generated due to the deformation of the piezoelectric device 108, the electromotive force Vpzt of the piezoelectric device 108 fails to completely coincide with the displacement of the beam 104 in consequence of the phenomenon that the charge is pulled out by the inductor L or the phenomenon that the charge flows to the output capacitor C1. In contrast, the piezoelectric device 110 is not connected to the inductor L or the output capacitor C1, the variation in the charge is directly reflected on the variation in the electromotive force Vpzt2 of the piezoelectric device 110. Therefore, the timing at which the electromotive force Vpzt2 of the piezoelectric device 110 takes an extreme value coincides with the timing at which the displacement u of the beam 104 takes the extreme value.

Therefore, as indicated by the arrows in FIG. 15B, by detecting the timing at which the electromotive force Vpzt2 of the piezoelectric device 110 takes the extreme values, and then setting the switch SW to the ON state for the period (T/2) half as long as the resonance period described above starting from that timing, it becomes possible to efficiently generate the electrical power.

Figure 16:
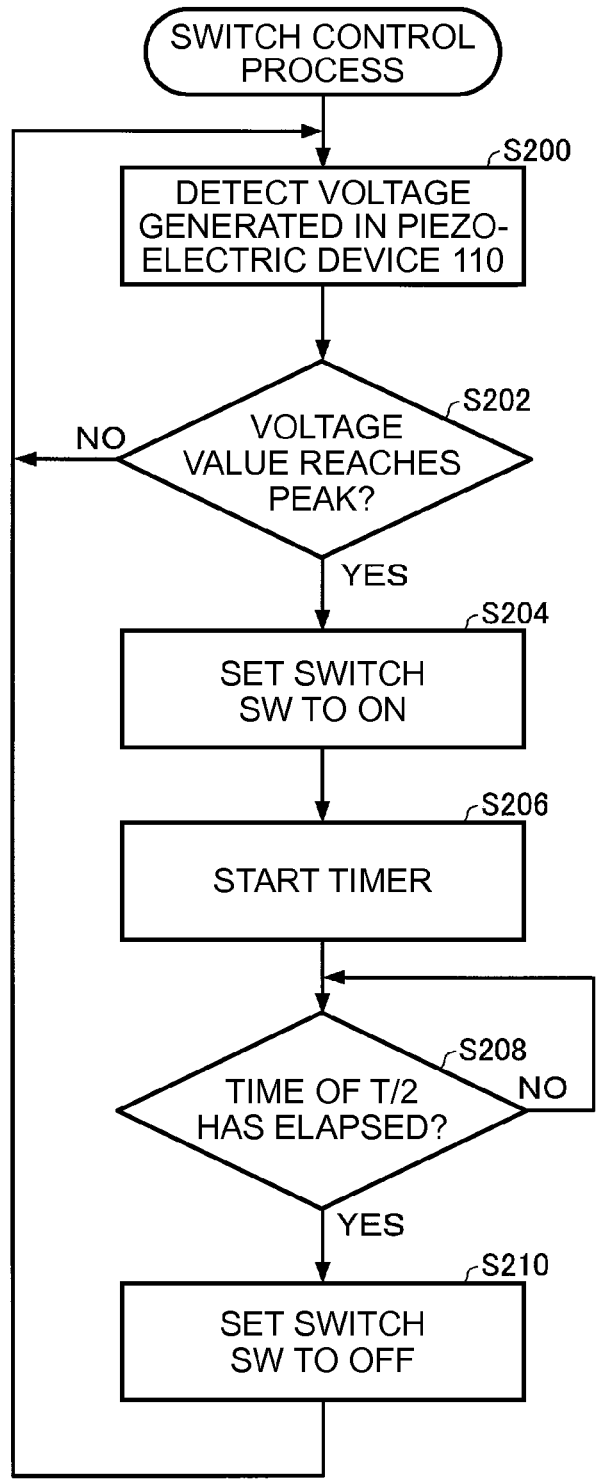
FIG. 16 is a flowchart for explaining a switch control process as an example of a method of controlling the power generation unit according to the embodiment.

FIG. 16 is a flowchart for explaining a switch control process as an example of a method of controlling the power generation unit 100 according to the present embodiment. The method of controlling the power generation unit 100 according to the present embodiment includes the step of detecting the voltage generated in the piezoelectric device 110, and the step of electrically connecting the piezoelectric device 108 and the inductor L to each other via the switch SW based on the detection result of the voltage.

When starting the switch control process, firstly, the voltage detect circuit 138 detects (step S200) the voltage Vpzt2 generated in the piezoelectric device 110. Then, the control circuit 136a determines (step S202) whether or not the voltage value thus detected in the voltage detect circuit 138 reaches a peak (i.e., whether or not the voltage value reaches the extreme value). Whether or not the voltage value reaches the peak can be determined in such a manner that, for example, it can be determined that the voltage value reaches the peak if the sign of the differential value obtained by performing the differentiation of the voltage waveform is varied.

Alternatively, since it is conceivable that the amplitude of the displacement of the beam 104 is roughly constant, it is conceivable that the voltage generated in the controlling piezoelectric device 110 is also roughly constant. Therefore, the maximum voltage value Vmax and the minimum voltage value Vmin have previously been stored, and then the voltage generated in the piezoelectric device 110 is compared with the maximum voltage value Vmax and the minimum voltage value Vmin. It is also possible to determine that the voltage value reaches the peak if the generated voltage of the piezoelectric device 110 exceeds the maximum voltage value Vmax, or falls below the minimum voltage value Vmin. The beam 104 is not necessarily deformed with completely the same amplitude, and therefore, the amplitude of the voltage generated in the piezoelectric device 110 does not necessarily become completely constant. However, even in such a case, by setting the maximum voltage value Vmax to a little bit lower value while setting the minimum voltage value Vmin to a little bit higher value, it becomes possible to detect the fact that the voltage value reaches the peak with a sufficient accuracy even if the amplitude of the beam 104 includes a minute variation.

In the case (the case of NO in the step S202) in which the peak of the voltage value generated in the controlling piezoelectric device 110 is not detected, the steps S200 through S202 are repeated until the peak of the voltage value generated in the controlling piezoelectric device 110 is detected. In the case (the case of YES in the step S202) in which the peak of the voltage value generated in the controlling piezoelectric device 110 is detected, the control section 130a set (step S204) the switch SW of the resonant circuit (the resonant circuit composed of the capacitive component Cg of the piezoelectric device 108 and the inductor L) to the ON state. In the present embodiment, the control circuit 136a of the control section 130a outputs a control signal to the switch SW to thereby set the switch SW to the ON state.

After the step S204, the control section 130a starts (step S206) a timer not shown and incorporated in the control circuit 136a. After the step S206, the control section 130a determines (step S208) whether or not the period half as long as the resonance period T of the resonant circuit composed of the capacitance component Cg of the piezoelectric device 108 and the inductor L. In the present embodiment, the control circuit 136a of the control section 130a performs the determination in the step S208. If the control circuit 136a determines (the case of NO in the step S208) that the period half as long as the resonance period T has not elapsed, the step S208 is repeated.

If the control section 136a determines (the case of YES in the step S208) that the period half as long as the resonance period T has elapsed, the control section 130a sets (step S210) the switch SW of the resonant circuit to the OFF state. In the present embodiment, the control circuit 136a of the control section 130a outputs a control signal to the switch SW to thereby set the switch SW to the OFF state.

After the step S210, the control section 130a repeats the steps S200 through S210.

By setting the switch SW of the resonant circuit to the ON/OFF states in such a manner as described hereinabove, the switch SW can be switched between the ON/OFF states at appropriate timings in accordance with the movement of the beam 104, and therefore, it becomes possible to efficiently generate the electrical power using the power generation unit 100.

It is preferable that the power generation amount of the power-generating piezoelectric device 108 is larger than the power generation amount of the controlling piezoelectric device 110. It is sufficient for the controlling piezoelectric device 110 to assure the power generation amount necessary for the control, and by setting the power generation amount of the power-generating piezoelectric device 108 to be large, the power generation unit 100 can efficiently generate the electrical power. Further, by setting the power generation amount of the controlling piezoelectric device 110 to the minimum power generation amount necessary for the control, the displacement resistance of the beam 104 due to the controlling piezoelectric device 110 is reduced, and the power generation efficiency is improved.

D. FOURTH EMBODIMENT

In the explanation of the power generation unit 100 according to the third embodiment described above, it is assumed that a single controlling piezoelectric device 110 is disposed. However, it is not necessarily required to provide the single controlling piezoelectric device 110, but a plurality of such controlling piezoelectric devices can also be provided. Hereinafter, a fourth embodiment with such a configuration will be explained. The constituents substantially the same as those of the second and third embodiments will also be attached with the same reference numerals in the fourth embodiment, and the detailed explanation therefor will be omitted.

Figure 17:
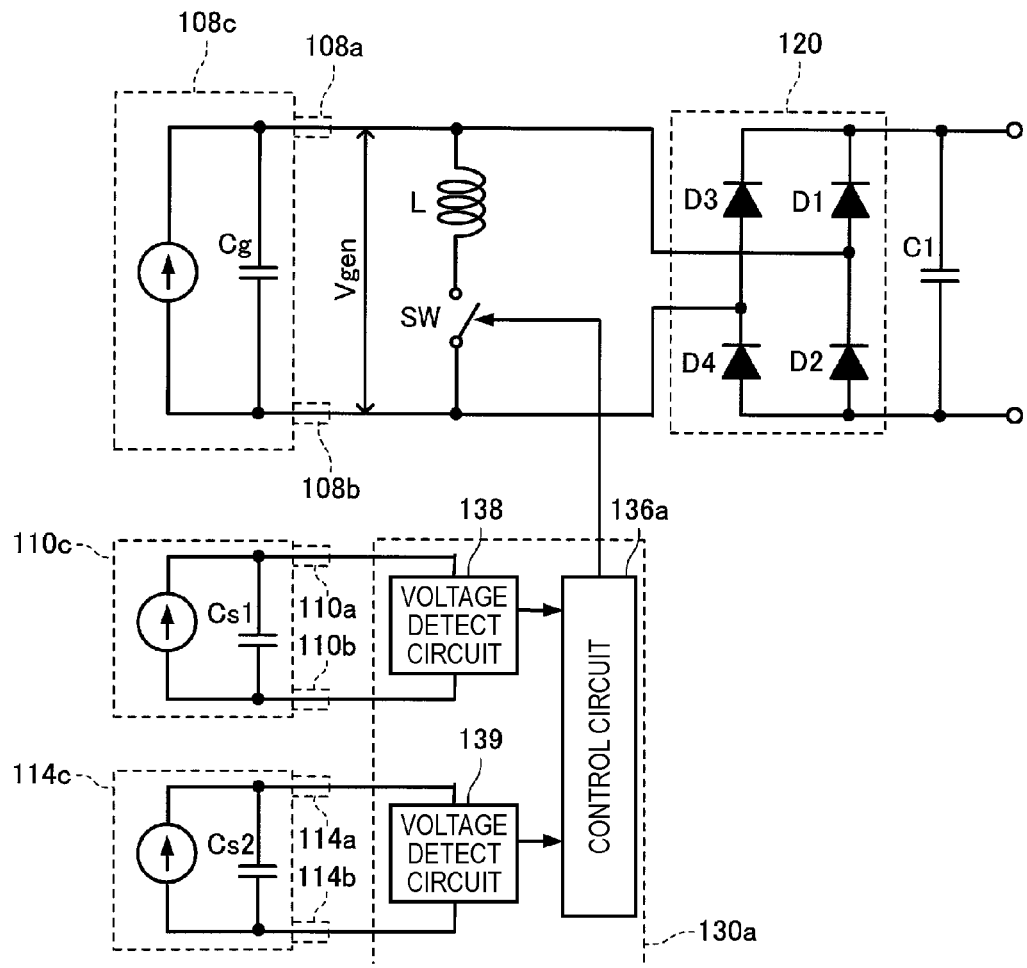
FIG. 17 is a circuit diagram showing an electrical structure of a power generation unit according to a fourth embodiment provided with a plurality of controlling piezoelectric devices.

FIG. 17 is a circuit diagram showing an electrical structure of the power generation unit 100 according to the fourth embodiment provided with a plurality of controlling piezoelectric devices. The mechanical structure of the power generation unit 100 according to the fourth embodiment is the same as the structure shown in FIGS. 13A and 13B. The power generation unit 100 according to the fourth embodiment is provided with two controlling piezoelectric devices 110, 114.

Similarly to the second embodiment, in the power generation unit 100 according to the fourth embodiment, if the power-generating piezoelectric device 108 has the maximum installable length and width with respect to the beam 104, the amount of power generation of the power-generating piezoelectric device 108 becomes large, and if the controlling piezoelectric devices 110, 114 have the minimum installable width (length in the direction along the shorter dimension of the beam 104), the displacement resistance of the beam 104 due to the controlling piezoelectric devices 110, 114 is reduced, and therefore, high power generation efficiency is obtained.

In the power generation unit 100 according to the fourth embodiment, by disposing the two controlling piezoelectric devices 110, 114 at the positions shifted toward the both sides of the beam 104 in the width direction thereof, the controlling piezoelectric devices 110, 114 can set the switch SW to the ON/OFF states at appropriate timings even in the case in which the beam 104 generates the displacement different between the vertical and horizontal positions, and therefore, the power generation unit 100 can be used in a variety of situations.

The first controlling piezoelectric device 110 is expressed as a combination of a current source and the capacitor Cs1 for storing charges, and the second controlling piezoelectric device 114 is expressed as a combination of a current source and the capacitor Cs2 for storing charges. The first electrode 110*a* and the second electrode 110*b* of the first controlling piezoelectric device 110 are connected to the control section 130*a*, and the first electrode 114*a* and the second electrode 114*b* of the second controlling piezoelectric device 114 are also connected to the control section 130*a*.

In the control section 130*a*, either one of a pair of first electrode 110*a* and the second electrode 110*b* and a pair of first electrode 114*a* and the second electrode 114*b* is selected, and then the voltage value of the selected one of the piezoelectric devices 110, 114 is detected to thereby control the switch SW. For example, the amount of power generation has previously been measured when installing the power generation unit 100 in the case of generating the electrical power while detecting the voltage value of the piezoelectric device 110 and in the case of generating the electrical power while detecting the voltage value of the piezoelectric device 114. Either one of the cases with a larger amount of power generation has previously been selected using a switch or the like provided to the control circuit 136*a*. If either one of the piezoelectric device 110 and the piezoelectric device 114 has previously been selected in such a manner as described above, by performing the switch control process described above with reference to FIG. 16, the ON/OFF control of the switch SW can be performed.

Although the two piezoelectric devices 110, 114 generate broadly similar voltage waveforms, a slight difference in voltage waveform and magnitude of the voltage amplitude can occur due to the factors such as the structure of the beam 104 and the production tolerance. Further, if the difference occurs in the voltage waveform, there is a possibility of causing the difference in power generation amount, and if the difference occurs in the magnitude of the voltage amplitude, there is a possibility of controlling the switch SW at a more appropriate timing when using one of the piezoelectric devices (having higher sensitivity as a sensor) with which a larger voltage amplitude can be obtained. Therefore, by having previously measured the power generation amount in the case of generating the electrical power while detecting the voltage of the piezoelectric device 110 and in the case of generating the electrical power while detecting the voltage of the piezoelectric device 114, and then selecting one with larger power generation amount, it becomes possible to more efficiently generate the electrical power.

In the explanation described above, it is assumed that either one of the pair (the first electrode 110*a* and the second electrode 110*b*) of terminals of the piezoelectric device 110 side and the pair (the first electrode 114*a* and the second electrode 114*b*) of terminals of the piezoelectric device 114 side is selected and used for controlling the switch SW. However, it is also possible to arrange that the first electrode 110*a* and the first electrode 114*a* are connected to each other, and the second electrode 110*b* and the second electrode 114*b* are connected to each other to thereby detect the electrical potential difference (the voltage value) between the first electrode side and the second electrode side, and thus, the switch SW is controlled. When controlling the switch SW, the switch control process described above with reference to FIG. 16 can be applied.

In consequence of the structure of the beam 104, the environment of the installation of the power generation unit 100, and so on, there is a possibility of generating a torsional deformation of the beam 104. When the torsional deformation occurs in the beam 104, there is a possibility that the phases of the voltage waveforms generated by the piezoelectric devices 110, 114 are shifted. However, by disposing the piezoelectric devices 110, 114 at the positions shifted toward the both sides of the beam 104 as shown in FIG. 13B, the influences of the torsional deformation with respect to the deflection of the beam 104 are reverse to each other. Therefore, by connecting the first electrode 110*a* and the first electrode 114a to each other, and the second electrode 110b and the second electrode 114b to each other, the influences of the torsional deformation of the beam 104 on the piezoelectric devices 110, 114 can be canceled out each other. As a result, even in the case in which the torsional deformation is caused in the beam 104, the switch SW can be controlled at appropriate timings without being affected by the torsional deformation, and therefore, it becomes possible to efficiently generate the electrical power.

E. MODIFIED EXAMPLES

A variety of modified examples exist in the first, second, third, and fourth embodiments described above. Hereinafter, these modified examples will briefly be explained.

E-1. First Modified Example

In the second and fourth embodiments described above, the explanation is presented assuming that the two controlling piezoelectric devices 110, 114 have the same length as that of the power-generating piezoelectric device 108, and the controlling piezoelectric devices 110, 114 are disposed at the positions shifted toward the both ends of the beam 104 in the width direction thereof. However, it is also possible to arrange that the two piezoelectric devices 110, 114 shorter than a half of the length of the power-generating piezoelectric device 108 are disposed at a central position of the beam 104 so as to be arranged in a line in the longitudinal direction.

Figure 18A:
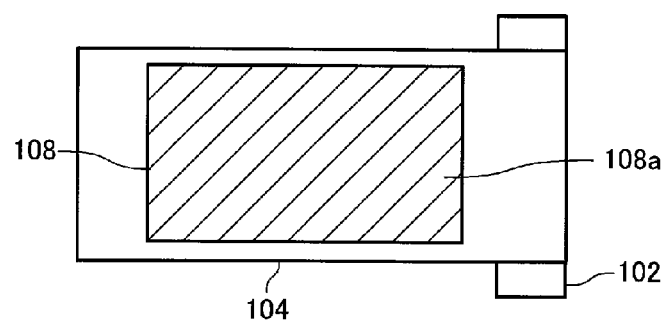
FIG. 18A is an explanatory diagram showing a first modified example provided with a power-generating piezoelectric device and two controlling piezoelectric devices.
Figure 18B:
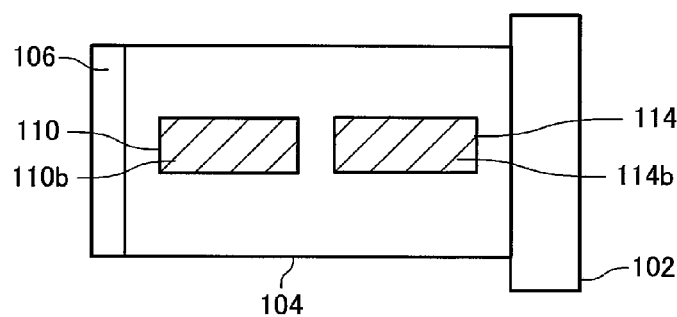
FIG. 18B is an explanatory diagram showing the first modified example provided with the power-generating piezoelectric device and the two controlling piezoelectric devices.

FIGS. 18A and 18B are explanatory diagrams showing the condition in which the power-generating piezoelectric device 108 and the two controlling piezoelectric devices 110, 114 are provided to the beam 104 of the power generation unit 100 according to the first modified example. FIG. 18A is a plan view thereof viewed from one surface of the beam 104. FIG. 18B is a plan view thereof viewed from the other surface of the beam 104. FIG. 18A shows the condition in which the power-generating piezoelectric device 108 is disposed, and FIG. 18B shows the condition in which the two controlling piezoelectric devices 110, 114 are disposed.

Depending on the structure of the beam 104 and the environment of the installation of the power generation unit 100, there is a possibility of causing the case in which the beam 104 is deformed in an undulating manner. Then, the parts with large deformation caused by the deflection of the beam 104 and the parts with small deformation occur along the longitudinal direction of the beam 104. Therefore, by having disposed the two short piezoelectric devices 110, 114 at the center of the beam 104 in a line along the longitudinal direction as shown in FIG. 18B, and selecting one of the piezoelectric devices generating the current waveform or the voltage waveform with a sufficient amplitude, it becomes possible to control the switch SW at appropriate timings even in the case in which the undulating deformation occurs in the beam 104.

Although the explanation is presented with reference to FIGS. 18A and 18B assuming that the two piezoelectric devices 110, 114 are disposed as the controlling piezoelectric devices, it is also possible to arrange that three or more piezoelectric devices are disposed.

E-2. Second Modified Example

In the various embodiments or the first modified example described above, the explanation is presented assuming that the controlling piezoelectric device 110 (and the controlling piezoelectric device 114) is disposed on the surface different from the surface provided with the power-generating piezoelectric device 108. However, it is also possible to dispose the controlling piezoelectric device 110 on the same surface as the surface provided with the power-generating piezoelectric device 108.

Figure 19:
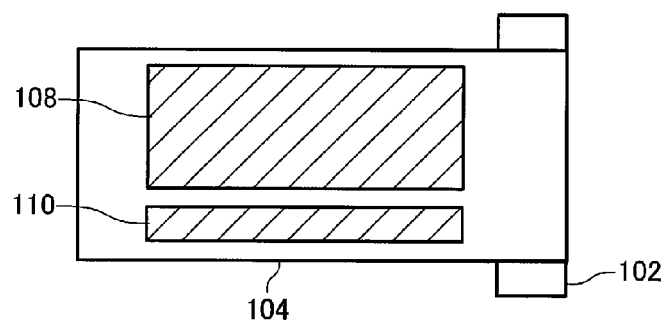
FIG. 19 is an explanatory diagram showing a second modified example having a power-generating piezoelectric device and a controlling piezoelectric device disposed on the same surface of a beam.

FIG. 19 is an explanatory diagram showing the condition in which the power-generating piezoelectric device 108 and the controlling piezoelectric devices 110 are provided to the same surface of the beam 104 of the power generation unit 100 according to a second modified example. In the example shown in FIG. 19, the power-generating piezoelectric device 108 and the controlling piezoelectric device 110 are disposed on the same surface of the beam 104. The controlling piezoelectric device 110 has the same length as the piezoelectric device 108, but has a width smaller than that of the piezoelectric device 108. As described above, if the controlling piezoelectric device 110 having roughly the same length is disposed in parallel to the power-generating piezoelectric device 108, roughly the same deformations occur respectively in the piezoelectric device 108 and the piezoelectric device 110. Therefore, it becomes possible to accurately detect the timing at which the deformation direction of the piezoelectric device 108 is switched to thereby control the switch SW at an appropriate timing.

Obviously, in the case of disposing the power-generating piezoelectric device 108 and the controlling piezoelectric device 110 on the same surface of the beam 104, the size (the area) of the power-generating piezoelectric device 108 is reduced in accordance with the size of the controlling piezoelectric device 110. As a result, as in the variety of embodiments or the first modified example described above, the power generation capacity is degraded compared to the case of disposing the power-generating piezoelectric device 108 and the controlling piezoelectric device 110 on the respective surfaces different from each other. However, as shown in FIG. 19, since the controlling piezoelectric device 110 has a small width, it is possible to reduce the decrease in area of the power-generating piezoelectric device 108 to a relatively small value, and the degradation of the power generation capacity can also be reduced to a relatively low level.

On the other hand, if the power-generating piezoelectric device 108 and the controlling piezoelectric device 110 are disposed on the same surface as in the second modified example shown in FIG. 19, the piezoelectric device 108 and the piezoelectric device 110 can be disposed in the same process. In contrast, if the power-generating piezoelectric device 108 and the controlling piezoelectric device 110 are disposed on the respective surfaces different from each other as in the variety of embodiments and the first modified example described above, the process of disposing the piezoelectric device 108 and the process of disposing the piezoelectric device 110 must be made separate from each other. Therefore, by disposing the power-generating piezoelectric device 108 and the controlling piezoelectric device 110 on the same surface as in the second modified example, it becomes possible to simplify the manufacturing process of the power generation unit 100. Conversely, in the case of disposing the power-generating piezoelectric device 108 and the controlling piezoelectric device 110 on the respective surface different from each other as in the variety of embodiments and the first modified example described above, since the area of the power-generating piezoelectric device 108 can be increased although the manufacturing process of the power generation unit 100 becomes complicated, it becomes possible to improve the power generation capacity.

Hereinabove, the explanation is presented assuming that the controlling piezoelectric device 110 has roughly the same length as the power-generating piezoelectric device 108, but has a width smaller than that of the piezoelectric device 108.

However, it is also possible to assume that the controlling piezoelectric device 110 having roughly the same width as the power-generating piezoelectric device 108 and a shorter length is used, and the piezoelectric devices 108, 110 are disposed on the same surface of the beam 104.

Figure 20:
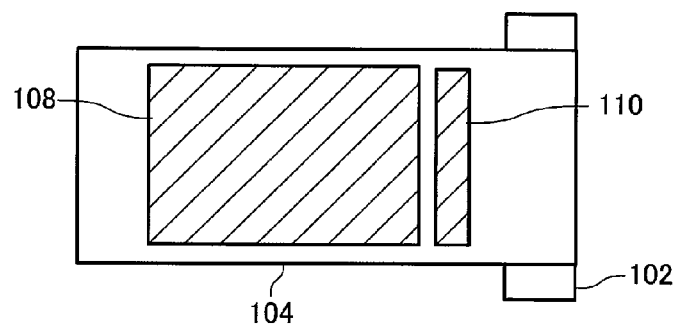
FIG. 20 is an explanatory diagram showing another configuration of the second modified example having the power-generating piezoelectric device and the controlling piezoelectric device disposed on the same surface of the beam.

FIG. 20 is an explanatory diagram showing another configuration of the second modified example having the power-generating piezoelectric device 108 and the controlling piezoelectric device 110 disposed on the same surface of the beam 104. In the example shown in FIG. 20, the deforming member (the beam 104) is configured including an undeformable stationary end (a connection section to the base 102), and the piezoelectric device 110 is disposed at a place closer to the stationary end than the piezoelectric device 108. In a so-called cantilever such as the beam 104, the bending moment of a part increases as the part moves from the tip and comes closer to the base 102, and the deformation amount of the beam 104 per unit length also increases in conjunction therewith. Therefore, by disposing the controlling piezoelectric device 110 in the vicinity of the base 102, the sensitivity as the sensor is improved, and the width of the controlling piezoelectric device 110 can be reduced accordingly. As a result, since the area of the power-generating piezoelectric device 108 can be increased, it becomes possible to suppress the degradation of the power generation capacity caused by disposing the power-generating piezoelectric device 108 and the controlling piezoelectric device 110 on the same surface.

E-3. Third Modified Example

In the second modified example described above, the explanation is presented assuming that the power-generating piezoelectric device 108 and the controlling piezoelectric device 110 are disposed on the same surface of the beam 104, and no other controlling piezoelectric device than the controlling piezoelectric device 110 is disposed. However, even in the case in which the power-generating piezoelectric device 108 and the controlling piezoelectric device 110 are disposed on the same surface of the beam 104, it is possible to arrange that a plurality of controlling piezoelectric devices is disposed.

Figure 21:
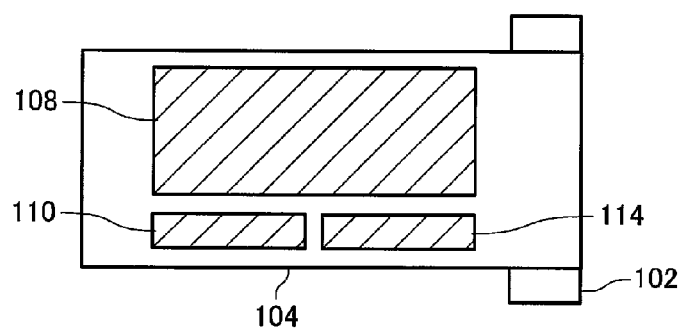
FIG. 21 is an explanatory diagram showing a third modified example having a power-generating piezoelectric device and a plurality of controlling piezoelectric devices disposed on the same surface.

FIG. 21 is an explanatory diagram showing a third modified example having the power-generating piezoelectric device 108 and a plurality of controlling piezoelectric devices 110, 114 disposed on the same surface. In the example shown in the drawing, the controlling piezoelectric devices 110, 114 narrower in width than the power-generating piezoelectric device 108 and less than half as short in length as the power-generating piezoelectric device 108 are arranged in a line and disposed in parallel to the piezoelectric device 108.

As described above, depending on the structure of the beam 104 and the environment of the installation of the power generation unit 100, there is a possibility of causing the case in which the beam 104 is deformed in an undulating manner. Then, the parts with large deformation caused by the deflection of the beam 104 and the parts with small deformation occur along the longitudinal direction of the beam 104. Therefore, depending on the position where the controlling piezoelectric devices 110, 114 are disposed, the case in which sufficient sensitivity (the current value to be detected) fails to be obtained can occur. Therefore, by having disposed the two short piezoelectric devices 110, 114 in a line along the longitudinal direction of the beam 104 as shown in FIG. 21, and selecting one of the piezoelectric devices which can provide sufficient sensitivity, it becomes possible to control the switch SW at appropriate timings even in the case in which the undulating deformation occurs in the beam 104. Obviously, the controlling piezoelectric devices are not limited to the two piezoelectric devices 110, 114, but it is also possible to arrange that three or more piezoelectric devices are disposed.

In the third modified example shown in FIG. 21, the explanation is presented assuming that the two short controlling piezoelectric devices 110, 114 are disposed in a line in the longitudinal direction of the beam 104. Therefore, it results that the two short controlling piezoelectric devices 110, 114 are disposed on one side with respect to the power-generating piezoelectric device 108. In contrast, it is also possible to arrange that the controlling piezoelectric devices 110, 114 having roughly the same length as that of the power generating piezoelectric device 108 and a narrower width are disposed on both sides of the power-generating piezoelectric device 108.

Figure 22:
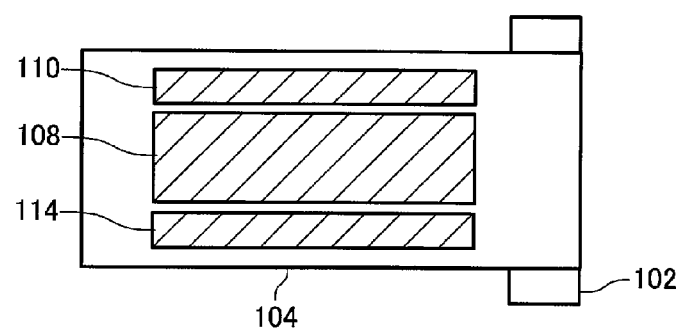
FIG. 22 is an explanatory diagram showing another configuration of the third modified example having the power-generating piezoelectric device and the plurality of controlling piezoelectric devices disposed on the same surface.

FIG. 22 is an explanatory diagram showing another configuration of the third modified example having the power-generating piezoelectric device 108 and a plurality of controlling piezoelectric devices 110, 114 disposed on the same surface. As described above, in consequence of the structure of the beam 104, the environment of the installation of the power generation unit 100, and so on, there is a possibility of generating a torsional deformation of the beam 104. When the torsional deformation occurs in the beam 104, there is a possibility that the phases of the current waveforms generated by the piezoelectric devices 110, 114 are shifted, and it becomes unachievable to switch the switch SW at an appropriate timing. However, the piezoelectric devices 110, 114 having a narrow width are disposed on both sides of the power-generating piezoelectric device 108 as shown in FIG. 22, the power generation amount when controlling the switch SW using the current values of the respective piezoelectric devices 110, 114 is measured, and one of the piezoelectric devices 110, 114 with larger power generation amount is selected. According to this procedure, the degradation of the power generation capacity can be reduced even in the case in which the torsional deformation is generated in the beam 104.

Although the embodiments and the modified examples are explained hereinabove, the invention is not limited to the embodiments and the modified examples described above, but can be put into practice in various forms within the scope or the spirit of the invention.

For example, in the embodiments and the modified examples described above, the explanation is presented assuming that the piezoelectric devices 108, 110 are attached to the beam 104 having the cantilever structure. However, the piezoelectric devices 108, 110 can be attached to any member providing the member is easily deformed in a repeated manner due to a vibration or the like. For example, the piezoelectric devices 108, 110 can be attached to a surface of a thin film, or to a side surface of a coil spring.

In the embodiments and the modified examples described above, the piezoelectric constant of the power-generating piezoelectric device 108 can also be higher than the piezoelectric constant of the controlling piezoelectric devices 110, 114. It is sufficient for the controlling piezoelectric devices 110, 114 to assure the power generation amount necessary for the control, and by setting the piezoelectric constant of the power-generating piezoelectric device 108 to be large, the power generation amount of the power generation unit 108 can be increased. As a result, it becomes also possible to reduce the area of the power-generating piezoelectric device 108, miniaturization of the beam 104 can be achieved.

In the embodiments and the modified examples described above, although the power generation amount of the power-generating piezoelectric device 108 is set to be larger than the power generation amount of the controlling piezoelectric devices 110, 114, in comparison between the power-generating piezoelectric device 108 and the controlling piezoelectric devices 110, 114, the power generation amount can be different due to the piezoelectric constant, the total area of the part capable of generating the electrical power, the thickness, and so on. It is also possible to make the power generation amount of the power-generating piezoelectric device 108 larger than the power generation amount of the controlling piezoelectric devices 110, 114 by installing the piezoelectric device in accordance with the displacement characteristics of the beam 104 in the part of the beam 104 with higher displacement frequency or larger displacement amount to thereby make the power generation amount different.

In the embodiments and the modified examples described above, two or more power-generating piezoelectric devices can also be provided. The larger the plural number of the power-generating piezoelectric devices is, the more the power generation amount becomes. Therefore, by providing a plurality of power-generating piezoelectric devices, a higher voltage than the voltage of the controlling piezoelectric device is generated from the power-generating piezoelectric device used for supplying the charge to the outside, and the power generation capacity of the power generation unit can be improved.

Since the power generation unit according to the invention generates power in accordance with the vibration or the transportation, by installing the power generation unit on a bridge, a building, or a possible landslide place, it is also possible to generate electrical power at the time of disaster such as an earthquake, and to supply the electricity to a network device such as an electronic apparatus at only the time of need (disaster).

The power generation unit according to the embodiment of the invention can be miniaturized, and can therefore be installed in every apparatus besides the electronic apparatus. For example, by applying the power generation unit according to the embodiment of the invention to a transportation device such as a vehicle or an electric train, it is also possible to generate power by the vibration due to the transportation, and to supply the electrical power efficiently to the equipment provided to the transportation device.

In this case, in order to cope with all of the vibrations, it is also possible to incorporate a plurality of power generation units 100 different in length of the beam 104 and weight of the mass 106 in the transportation device. For example, it is also possible to constitute a power generating unit having the plurality of power generation units 100 fixed to the base 102 common to the power generation units 100.

It is also possible to incorporate the power generation unit according to the embodiment of the invention in an electronic apparatus such as a remote controller instead of the battery.

Further, the power generation unit according to the embodiment of the invention can be provided with the same shape as, for example, a button battery or a dry-cell battery, and can also be used in general electronic apparatuses instead of being installed in a specific electronic apparatus or the like. In this case, since it is possible to charge the capacitor by a vibration, the power generation unit can be used as a battery even in the time of disaster with electricity lost. Since the life thereof is longer than that of a primary cell, reduction of environmental load can be achieved in terms of a life cycle.

The invention includes configurations (e.g., configurations having the same function, the same way, and the same result, or configurations having the same object and the same advantages) substantially the same as those described in the embodiment section. The invention includes configurations obtained by replacing non-essential parts of the configurations described in the embodiment section. The invention includes configurations providing the same functions and the same advantages or configurations capable of achieving the same object as those of the configurations described in the embodiment section. The invention includes configurations obtained by adding technologies known to the public to the configurations described in the embodiment section.

This application claims priority to Japanese Patent Application No. 2011-219333 and Application No. 2011-218989 filed on Oct. 3, 2011, the entirety of which is hereby incorporated by reference.

What is claimed is:

1. A power generation unit comprising:
    a deforming member adapted to deform while switching a deformation direction;
    a first piezoelectric device provided to the deforming member;
    a second piezoelectric device provided to the deforming member;
    an inductor electrically connected to the first piezoelectric device;
    a switch disposed between the first piezoelectric device and the inductor; and
    a control section adapted to detect a current generated in the second piezoelectric device, and if the current detected has a level one of equal to and higher than a predetermined level, electrically connect the first piezoelectric device and the inductor to each other via the switch.

2. The power generation unit according to claim 1, wherein the control section electrically connects the switch at a timing at which a deformation direction of the deforming member is switched, and then electrically disconnects the switch at a timing at which a predetermined period has elapsed.

3. The power generation unit according to claim 1, wherein the control section includes
    a capacitor connected in parallel to the second piezoelectric device, and
    a current detect circuit adapted to detect a current flowing in the capacitor.

4. The power generation unit according to claim 1, wherein the deforming member has a plurality of surfaces,
    the first piezoelectric device is provided to a first surface of the deforming member, and
    the second piezoelectric device is provided to a second surface of the deforming member different from the first surface.

5. The power generation unit according to claim 1, wherein the deforming member has a plurality of surfaces, and
    the first piezoelectric device and the second piezoelectric device are provided to a same surface of the deforming member.

6. The power generation unit according to claim 1, wherein the deforming member has an undeformable stationary end, and
    the second piezoelectric device is disposed at a place closer to the stationary end of the deforming member than a place in the deforming member at which the first piezoelectric device is disposed.

7. An electronic apparatus comprising the power generation unit according to claim 1.

8. A transportation device comprising the power generation unit according to claim 1.

9. A method of controlling a power generation unit including
    a deforming member adapted to deform while switching a deformation direction, a first piezoelectric device provided to the deforming member, a second piezoelectric device provided to the deforming member, an inductor electrically connected to the first piezoelectric device, and a switch disposed between the first piezoelectric device and the inductor;

the method comprising:

detecting a current generated in the second piezoelectric device; and connecting the first piezoelectric device and the inductor electrically to each other via the switch based on the detection result of the current.

10. A power generation unit comprising:

a deforming member adapted to deform while switching a deformation direction;

a first piezoelectric device provided to the deforming member;

a second piezoelectric device provided to the deforming member, and adapted to generate electrical power, an amount of which is smaller than an amount of electrical power generated by the first piezoelectric device;

an inductor electrically connected to the first piezoelectric device;

a switch disposed between the first piezoelectric device and the inductor; and a control section adapted to detect a voltage generated in the second piezoelectric device, and if the voltage detected has a level one of equal to and higher than a predetermined level, electrically connect the first piezoelectric device and the inductor to each other using the switch.

11. The power generation unit according to claim 10, wherein the first piezoelectric device is higher in piezoelectric constant than the second piezoelectric device.

12. The power generation unit according to claim 10, wherein the first piezoelectric device is larger in area of a part capable of generating electrical power than the second piezoelectric device.

13. The power generation unit according to claim 10, wherein the number of the first piezoelectric devices is plural.

14. The power generation unit according to claim 10, wherein the deforming member has a plurality of surfaces, the first piezoelectric device is provided to a first surface of the deforming member, and the second piezoelectric device is provided to a second surface of the deforming member different from the first surface.

15. The power generation unit according to claim 10, wherein the first piezoelectric device and the second piezoelectric device are provided to a same surface of the deforming member.

16. The power generation unit according to claim 10, wherein the first piezoelectric device and the second piezoelectric device are equal in length in a longitudinal direction to each other.

17. The power generation unit according to claim 10, wherein the deforming member has an undeformable stationary end, and the second piezoelectric device is disposed at a place closer to the stationary end of the deforming member than a place of the deforming member at which the first piezoelectric device is disposed.

18. An electronic apparatus comprising the power generation unit according to claim 10.

19. A transportation device comprising the power generation unit according to claim 10.

* * * * *